US012579049B2

(12) United States Patent
Sarangi et al.

(10) Patent No.: US 12,579,049 B2
(45) Date of Patent: Mar. 17, 2026

(54) IN-SYSTEM TESTING FOR AUTONOMOUS SYSTEMS AND APPLICATIONS

(71) Applicant: NVIDIA Corporation, Santa Clara, CA (US)

(72) Inventors: Shantanu Sarangi, Saratgoa, CA (US); Milind Sonawane, Santa Clara, CA (US); Alex Hsu, New Taipei (TW); Sailendra Chadalavada, Saratoga, CA (US); Nitin Yogi, Milpitas, CA (US); Nithin Valentine, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 78 days.

(21) Appl. No.: 18/353,552

(22) Filed: Jul. 17, 2023

(65) Prior Publication Data

US 2025/0028620 A1 Jan. 23, 2025

(51) Int. Cl.
*G06F 11/34* (2006.01)
*G01R 31/317* (2006.01)
*G01R 31/3183* (2006.01)

(52) U.S. Cl.
CPC .... *G06F 11/3457* (2013.01); *G01R 31/31721* (2013.01); *G01R 31/3183* (2013.01)

(58) Field of Classification Search
CPC .......... G06F 11/3457; G01R 31/31721; G01R 31/3183
See application file for complete search history.

(56) References Cited

U.S. PATENT DOCUMENTS

| | | | |
|---|---|---|---|
| 2009/0213225 A1* | 8/2009 | Jin ......................... | H04N 23/63 |
| | | | 348/836 |
| 2016/0335790 A1* | 11/2016 | Fleishman .............. | G06T 7/143 |
| 2017/0299654 A1* | 10/2017 | Douskey ............ | G01R 31/3177 |
| 2023/0204662 A1* | 6/2023 | Margulis .......... | G01R 31/31713 |
| | | | 714/735 |
| 2023/0305993 A1* | 9/2023 | Davis ..................... | G06F 30/39 |

* cited by examiner

*Primary Examiner* — Yair Leibovich
(74) *Attorney, Agent, or Firm* — Sanders IP Law

(57) ABSTRACT

Systems and methods are disclosed that relate to applications and platforms for performing in-system testing for autonomous or semi-autonomous systems and applications. In some embodiments, resources of a computing system may be grouped into one or more subsets of system elements (e.g., "a chiplet") and may be configured to be controlled via an associated local controller, which may enable and/or disable the chiplet as targeted. In embodiments, the local controllers may receive instructions from a central controller and, via the enabling and/or disabling of the chiplets, may maintain a number of resources consumed during system testing within a threshold. As a result, the system may be configured to perform system testing without additional resources and/or without redirecting resources that may be intended for other operations.

20 Claims, 13 Drawing Sheets

*700*

Perform A First Test With Respect To A Computing System, The First Test Being Performed While A First Chiplet Is Enabled And While A Second Chiplet Is Disabled — B702

Perform A Second Test With Respect To The Computing System, The Second Test Being Performed While The Second Chiplet Is Enabled And While The First Chiplet Is Disabled — B704

B602 — Power On

B604 — Determine Disabled Chiplets

B606 — Disabled Chiplets To Central Controller

B608 — Perform System Test

Test Result Verification
*B610*

Chiplet Disabled?  B612

Yes

No

Compare Test Results With Expected Results  B614

All Chiplets Verified?  B616

No

Yes

Power Off  B618

700

Perform A First Test With Respect To A Computing System, The First Test Being Performed While A First Chiplet Is Enabled And While A Second Chiplet Is Disabled ⟍ B702

Perform A Second Test With Respect To The Computing System, The Second Test Being Performed While The Second Chiplet Is Enabled And While The First Chiplet Is Disabled ⟍ B704

*1000*

Application Layer
*1040*

Application(s)
*1042*

Software Layer
*1030*

Software
*1032*

Framework Layer
*1020*

Job Scheduler
*1033*

Configuration
Manager *1034*

Distributed File System
*1038*

Resource Manager
*1036*

Data Center Infrastructure Layer
*1010*

Resource Orchestrator
*1012*

Grouped Computing Resources
*1014*

Node C.R.
*1016(1)*

Node C.R.
*1016(2)*

• • •

Node C.R.
*1016(N)*

IN-SYSTEM TESTING FOR AUTONOMOUS SYSTEMS AND APPLICATIONS

BACKGROUND

Testing on systems or components may include test parameters that limit the timing and/or the performance of the system testing. For example, some systems may include one or more factors that may limit system resources that are used to perform the system testing.

In some traditional implementations, some system components of a system undergoing system testing may experience power leakage during the system testing, where the power leakage may be associated with the system components being tested. Some systems may include one or more limitations, such as a power budget, that may constrain an amount of power that may be consumed by the system components during system testing. In some circumstances, system testing may be limited and/or delayed as fewer system components may be tested at a time in view of the limitations (e.g., power budget) and the power leakage by the system components.

Alternatively, or additionally, some systems performing system testing may experience difficulty and/or may not be configured to obtain results from system components that may be disabled at the time of system testing. For example, some systems may include one or more system components that may be disabled, and during system testing, the disabled system components may not respond and/or may generate an error as part of system testing.

Some systems may include individual controllers associated with the system components and the individual controllers may provide an indication to the system that the associated system component may be disabled, such as during system testing. In some circumstances, the individual controllers may increase the amount of power consumed, including during system testing, which may limit and/or delay system testing in view of the power budget associated with the system. Alternatively, in some systems, in instances in which the system component is disabled, the associated local controller may be disabled which may contribute to the system satisfying a lower power budget than instances in which the associated local controller is enabled. However, in some circumstances, a disabled local controller may not provide an indication to the system that the associated system component is disabled, which may cause an interrupt and/or error during system testing.

In some settings in which the system may be used (e.g., an automotive setting), the power consumption by the system components may affect the battery life and/or reliability of the system components and/or the system. As such, limiting the power consumed by the system components and/or the system may improve the battery life and/or reliability of the system components, and by extension, the battery life and/or reliability of the system.

In some circumstances, there may be difficulties in reducing power consumption by the system components and/or the system. For example, the system components may include a large transistor count, multiple voltage rails, and/or low latency requirements during system testing, any of which increases the power consumed by the system components.

SUMMARY

Embodiments of the present disclosure relate to applications and platforms for performing in-system testing for autonomous or semi-autonomous systems and applications. In some embodiments, resources of a computing system may be grouped into one or more subsets of system elements (e.g., "a chiplet") and may be configured to be controlled via an associated local controller, which may enable and/or disable (e.g., power on and/or power off) the chiplet as targeted. In some embodiments, the local controller may enable and/or disable the associated chiplet at various instances during one or more system tests. In some embodiments, the local controllers may receive instructions from a central controller and via the enabling and/or disabling of the chiplets, may maintain a number of resources consumed during system testing within a threshold. As a result, the system may be configured to perform system testing without additional resources and/or without redirecting resources that may be intended for other operations.

BRIEF DESCRIPTION OF THE DRAWINGS

The present systems and methods for in-system testing for autonomous and semi-autonomous systems and applications are described in detail below with reference to the attached drawing figures, wherein.

DETAILED DESCRIPTION

Figure 1:
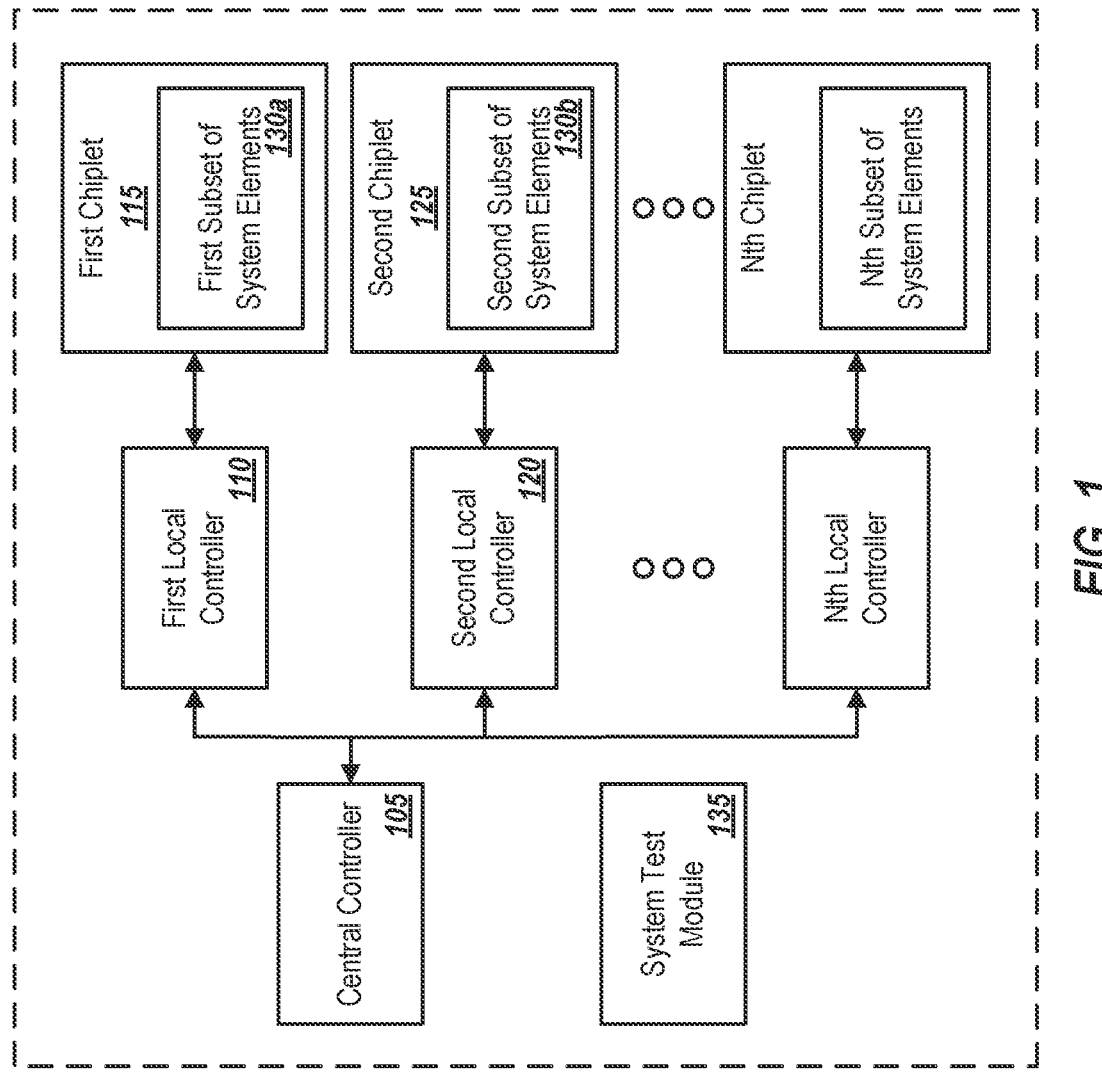
FIG. 1 illustrates an example system configured to perform in-system testing, according to one or more embodiments of the present disclosure.
Figure 1:

Systems and methods disclosed herein may relate to in-system testing that may be used by machines, such as machines or systems capable of performing one or more autonomous or semi-autonomous operations. Example ego-machines may include, but are not limited to, vehicles (land, sea, space, and/or air), robots, robotic platforms, machinery, factory equipment, drones, etc. By way of example, the ego-machine computing applications may include one or more applications that may be executed using an autonomous and/or semi-autonomous vehicle or machine, such as an example autonomous or semi-autonomous vehicle or machine 800 (alternatively referred to herein as "vehicle 800" or "ego-machine 800") described with respect to FIGS. 8A-8D. In the present disclosure, reference to an "autonomous vehicle" or "semi-autonomous vehicle" may include any vehicle that may be configured to perform one or more autonomous or semi-autonomous control operations (e.g., navigation or driving operations). As such, such machines may also include vehicles in which an operator is required or in which an operator may perform such operations as well.

Alternatively, or additionally, the systems and methods described herein may be used by, without limitation, non-autonomous vehicles or machines, semi-autonomous vehicles or machines (e.g., in one or more adaptive driver assistance systems (ADAS)), autonomous vehicles or machines, piloted and un-piloted robots or robotic platforms, warehouse vehicles, off-road vehicles, vehicles coupled to one or more trailers, flying vessels, boats, shuttles, emergency response vehicles, motorcycles, electric or motorized bicycles, aircraft, construction vehicles, underwater craft, drones, and/or other vehicle types. Further, the systems and methods described herein may be used for a variety of purposes, by way of example and without limitation, for machine control, machine locomotion, machine driving, synthetic data generation, model training, perception, augmented reality, virtual reality, mixed reality, robotics, security and surveillance, simulation and digital twinning, autonomous or semi-autonomous machine applications, deep learning, environment simulation, object or actor simulation and/or digital twinning, data center processing, conversational AI, light transport simulation (e.g., ray-tracing, path tracing, etc.), collaborative content creation for 3D assets, cloud computing and/or any other suitable applications.

Disclosed embodiments may be included in a variety of different systems such as automotive systems (e.g., a control system for an autonomous or semi-autonomous machine, a perception system for an autonomous or semi-autonomous machine, an in-system testing (e.g., built-in self-test (BIST)) system for an autonomous or semi-autonomous machine), systems implemented using a robot, aerial systems, medial systems, boating systems, smart area monitoring systems, systems for performing deep learning operations, systems for performing simulation operations, systems for performing digital twin operations, systems implemented using an edge device, systems incorporating one or more virtual machines (VMs), systems for performing synthetic data generation operations, systems implemented at least partially in a data center, systems for performing conversational AI operations, systems for hosting real-time streaming applications, systems for presenting one or more of virtual reality content, augmented reality content, or mixed reality content, systems for performing light transport simulation, systems for performing collaborative content creation for 3D assets, systems implemented at least partially using cloud computing resources, and/or other types of systems.

Some computing systems may be configured to perform various electronic tasks. In some circumstances, a computing system may include multiple system elements that may operate independently of one another to perform the electronic tasks. In some circumstances, the system elements may include one or more of processing devices, memory devices, data storage devices, communication devices, and/or the like. The electronic tasks may be performed using the computing systems and/or the system elements in various systems and/or environments, which may include, but are not limited to, autonomous vehicles or machines, automotive or machine performance, and/or automotive or machine safety.

In some circumstances, one or more of the system elements may be grouped into one or more subsets of the system elements, where an individual subset of the system elements may be referred to as, without limitation, a "chiplet." In some embodiments, an individual chiplet may include one or more system elements. The grouping of the one or more system elements into respective chiplets may be based on a physical hierarchy, an operational hierarchy, a power hierarchy, and/or other characteristics associated with the system elements. In some circumstances, the operational environment associated with the computing system may contribute to the grouping of the system elements. For example, in some automotive applications, a power budget may introduce a limitation (e.g., a power budget constraint) that may contribute to the grouping of the system elements into the respective chiplets.

In some circumstances, computing systems may be configured in a manner that allows one or more chiplets to be disabled at a time. The disabling of the chiplets may be based on different operational requirements or targets at a given time in some instances. For example, a first chiplet may be configured to perform a first function and a second chiplet may be configured to perform a second function. In instances in which the operational requirements or targets relate to the first function but not the second function (e.g., based on a specific computing task to be performed), the first chiplet may be enabled and the second chiplet may be disabled. Additionally, or alternatively, both the first chiplet and the second chiplet may be configured to perform the first function, but the operational requirements or targets may allow for only one of the first or second chiplets to perform the first function. In these or other instances, one of the first or second chiplets may be enabled and may perform the first function, while the other may be disabled. As such, a computing system may include one or more computing configurations which may be associated with various permutations of enabled and/or disabled chiplets within the computing system. For example, a first computing configuration may include a first computing system having a first chiplet disabled with one or more other chiplets enabled, a second computing configuration may include the first computing system having a second chiplet disabled with the first chiplet enabled or disabled and one or more other chiplets enabled, a third computing configuration may include the first computing system having the first chiplet disabled and a third chiplet disabled, with the second chiplet enabled or disabled, and so forth.

In some circumstances, an individual chiplet may have associated therewith at least one controller that may be configured to perform operations associated with the system elements included in the chiplet—such as a system test. In some circumstances, a local controller may be configured to power gate a corresponding chiplet, which may include adjusting a current delivered to the chiplet. For example, a local controller may cause current to the associated chiplet to be reduced or restricted (e.g., adjusted), which may limit or cease operation of the associated chiplet. In the present disclosure, the one or more controllers associated with an individual chiplet may be referred to as a "local chiplet controller" or a "local controller." Reference to the term "local" is meant to convey being specifically associated with the corresponding chiplets and is not necessarily limiting with respect to physical location with respect to such components.

In some circumstances, a system test may be performed on a computing system (and, by extension, on associated system elements and/or chiplets) which may contribute to detecting various defects that may occur in production of the computing system and/or during operation of the computing system. In some circumstances, the system test may include at least a memory test and/or a logic test. In some circumstances, the system test may be distributed to the local controllers associated with the chiplets using a central controller that may be communicatively coupled to the local controllers. Further, the system test may be performed on individual chiplets of the computing system using the respective local controllers. In the present disclosure, the controller associated with the computing system may be referred to as a "central controller." Reference to the term "central" is meant to convey being associated with two or more of the local controllers and/or various components of the computing system (e.g., two or more chiplets) and is not necessarily limiting with respect to physical location with respect to such components.

In conjunction with the performance of a system test, a test image may be obtained using the computing system which may distribute the system test via the central controller to the various local controllers associated with the respective chiplets. In some embodiments, the test image may include one or more stimuli (e.g., inputs) that may be provided to the computing system (e.g., to the chiplets of the computing system). In addition, the test image may include corresponding expected behavior of the computing system in response to receiving the respective stimuli.

An example of system testing may include providing one or more stimuli (e.g., as included in the test image) to the computing system (e.g., to the chiplets of the computing system) and identifying the behavior of the computing system that occurs in response to the stimuli (e.g., obtaining and/or recording outputs or responses to the stimuli). In these or other embodiments, the identified behavior may be compared to the expected behavior as indicated using the test image. In some embodiments, the test image may include stimuli and expected behavior for at least memory testing or logic testing.

In these or other circumstances, the performance of system testing on the chiplets of the computing system may consume an amount of power. Further, the amount of power consumed as part of system testing may vary depending on which chiplets are being tested at a given time. For example, the testing of certain chiplets may consume more power than the testing of other chiplets. Additionally, or alternatively, as the number of chiplets being tested at any given time increases, the amount of power that is consumed may increase.

In addition, some computing systems may include power budget constraints which may be associated with the system and/or environment in which the computing system is configured to operate. For example, a power budget constraint associated with the automotive safety application may include a threshold level of power that may limit the amount of power that may be consumed at any one time. In these or other embodiments, the power budget constraints may limit the amount of power that may be consumed at any given time while performing system testing. In some circumstances, an amount of power consumed during system testing may be associated with a power consumed by an aggregation of the power consumed by individual chiplets in the computing system that are being tested. In these or other circumstances, the performance of the system test may be limited, slowed, and/or restricted based on the power budget constraints relative to the power consumed during system testing. As such, in some instances, power budget constraints may be such that not every chiplet of a computing system may be tested at the same time. Instead, one or more subsets of chiplets may be tested at a given time to help ensure that power budget constraints may be met. As such, system testing may be performed in a manner in which different computing configurations in which different subsets of chiplets are enabled and disabled may be tested at different times rather than testing the entire computing system at the same time.

One or more aspects of the present disclosure includes one or more system elements of a computing system grouped into a respective chiplet (or other grouping or demarcated component(s) or element(s)) of multiple chiplets (or other groupings or demarcated element(s) or component(s)). In instances in which a request to perform a system test is obtained (e.g., received, provided to, generated by, accessed, etc.) using the computing system, one or more chiplets of the multiple chiplets may be power gated. A central controller of the computing system may select one or more subsets (e.g., where one or more chiplets may be included in an individual subset) of the multiple chiplets for system testing. In some embodiments, the selection of a subset may be based on at least a power budget constraint associated with the computing system. As part of system testing, the central controller may transmit one or more instructions to individual local controllers associated with a respective chiplet. For example, based on the selection of a first subset of chiplets, the central controller may cause individual chiplets in the first subset to power on—such as via the respective local controllers. The system testing may include the respective local controllers causing system testing to be performed on associated chiplets included in the first subset. Following the performance of the system testing, the central controller may cause the local controllers to power gate the respective chiplets that may be included in the first subset. In some embodiments, the operations of powering on a subset of chiplets, performing system testing thereon, and power gating the subset of chiplets may continue until system testing is performed with respect to one or more of the chiplets included in the computing system. In some circumstances, power gating the subset of the chiplets may contribute to the computing system remaining within a power budget constraint.

In some embodiments, the computing system may be configured to perform system testing on multiple chiplets (e.g., a subset of the chiplets) in a manner that may allow for one test image to be used for the system testing of various configurations of the multiple chiplets. For example, in instances in which the computing system includes one or more disabled chiplets, one or more aspects of the present disclosure may be configured to restrict the testing of the disabled chiplets, such that the system testing of the chiplet may not be interrupted or corrupted with false failures. For example, in instances in which a first chiplet of a computing system is disabled, the test image may not be provided to the disabled first chiplet. Alternatively, or additionally, in instances in which a first chiplet of a computing system is disabled, the stimulus associated with the first chiplet may be automatically blocked and an automatic response may be generated in place of a stimulus response from the disabled first chiplet. The automatic response may include a flag or notification to the system that any response from the first chiplet may be ignored. Alternatively, or additionally, the automatic response may include a completion indication associated with the disabled first chiplet. The system testing associated with the computing system accordingly may be able to test the enabled portions of the computing system using a test image that includes stimuli for the disabled first chiplet, while also not being interrupted and/or indicated as failing even though the first chiplet may not in fact be operation during the testing.

Accordingly, the computing system may be configured such that providing the test image to the various configurations of the multiple chiplets (e.g., various permutation of chiplets, as described herein) may not cause false failures and/or may be compatible with the various configurations of the multiple chiplets. As such, various configurations of the test image corresponding to the various configurations of the multiple chiplets may be avoided.

By contrast, in some prior approaches, performing system testing on with respect to a first computing configuration and with respect to a second computing configuration may include using a first test image and a second test image, respectively. For example, the first test image may only include stimuli and expected behavior that correspond to the chiplets that are enabled in the first computing configuration and the second test image may only include stimuli and expected behavior that correspond to the chiplets that are enabled in the second computing configuration. The customization of the test images in this manner may be to avoid stimuli being provided to disabled chiplets, which may create problems in the test results—such as indications of false failures by the disabled chiplets. However, preparing unique test images for individual permutations of the computing configurations may be time consuming to determine and/or develop as many permutations as may be possible for any given computing system.

Aspects of the present disclosure may contribute to the computing system remaining within a power budget constraint. Additionally, the management of the power consumed by the chiplets may contribute to improved battery life and/or improve battery reliability in the computing system and/or the associated component in which the computing system operates. For example, increasing power consumption may cause heating in the computing system, which heat may impact battery life and/or battery reliability of a component associated with the computing system. Alternatively, or additionally, heat from an increase in power consumption may cause electromigration, which may cause aging defects and/or reliability issues with the computing system.

Further, some aspects of the present disclosure may allow system testing to be performed on a computing system using the same test image for any computing configuration, such that developing and/or modifying the test image for various computing configurations may be unnecessary. For example, a first computing system having a first computing configuration including a first disabled chiplet and the first computing system having a second computing configuration including a second disabled chiplet may be individually tested using the same test image and without modification to the test image. Using the same test image for different computing configurations of a computing system may reduce complexity in developing customized test images for various permutations to computing configurations of a computing system and/or may eliminate a need to update a test image in response to a change in a computing configuration of a computing system.

Referring now to FIG. 1, FIG. 1 illustrates an example computing system 100 (or "system 100") configured to perform in-system testing, according to one or more embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out using hardware, firmware, and/or software. For instance, various functions may be carried out using a processor executing instructions stored in memory.

In some embodiments, the system 100 may include a central controller 105, a first local controller 110, a first chiplet 115, a second local controller 120, a second chiplet 125, and a system test module 135. The first chiplet 115 may include a first subset of system elements 130a. The second chiplet 125 may include a second subset of system elements 130b. Further, as illustrated in FIG. 1, the system 100 may include "n" number of chiplets and corresponding local controllers and/or subset of system elements. For ease of explanation, operations are described herein with respect to the first chiplet 115, the first local controller 110, the second chiplet 125, and the second local controller 125. However, such operations may correspond to any one of one or more other local controllers or chiplets, including with respect to one or more or all possible permutations of chiplets and corresponding local controllers. In some embodiments, the system 100 may be configured to control the chiplets included in the system such that system testing may be performed within a threshold, such as a power budget constraint, and the system testing may use a uniform test image that may be distributed to individual chiplets.

In some embodiments, the first subset of system elements 130a and/or the second subset of system elements 130b (referred to collectively as "system elements 130") may include one or more components, such as electronic components, included in the system 100. In some embodiments, the system elements 130 may be configured to perform one or more electronic tasks and/or the system elements may be configured to contribute to the performance of one or more electronic tasks such that the system 100 may perform electronic tasks via the system elements 130. For example, the system elements 130 may include one or more of processing device(s), memory device(s), data storage device(s), communication device(s), etc., where an individual or collective of one or more system elements 130 may be used in the performance of electronic tasks by the system 100. In some embodiments, the system elements 130 may perform electronic tasks in various environments, which may include, but not be limited to, autonomous vehicles or machines, automotive or machine performance, and/or automotive or machine safety.

In some embodiments, the system elements 130 may be grouped into subsets, such as the first subset of system elements 130a and the second subset of system elements 130b, and the grouping of the system elements 130 may be in view of one or more factors. In some embodiments, the factors that may contribute to the grouping the system elements 130 may include a power hierarchy, a physical hierarchy, a logical hierarchy, an operational hierarchy and/or other characteristics associated with the system elements 130.

A power hierarchy may include grouping one or more of the system elements 130 according to an expected power used, an actual power used, an expected power produced, an actual power produced, and/or other power-based characteristics associated with the one or more system elements 130. For example, the system 100 may include a power budget constraint for system testing which may direct a number of system elements to be included in the first subset of system elements 130*a* and/or the second subset of system elements 130*b*. For example, the first subset of system elements 130*a* may include two system elements, such that when both of the two system elements are in operation, a power budget constraint may be satisfied.

A physical hierarchy may include grouping one or more of the system elements 130 according to a physical location of the one or more of the system elements 130, such as relative to one another, relative to the first local controller 110 and/or the second local controller 120, and/or other physical-based characteristics. For example, a first element and a second element may be grouped into the first subset of system elements 130*a* where the first element and the second element may be disposed proximate to one another.

An operational hierarchy may include grouping one or more of the system elements 130 according to functions performed using the one or more of the system elements 130. For example, a first element may be a processing device and a second element may be a processing device and the first element and the second element may be grouped into the first subset of system elements 130*a* in response to both being processing devices that may perform the same or similar types of functions. In another example, a first element may be a processing device that may perform a first task, a second element may be a processing device that may perform the first task, and a third element may be a processing device that may perform a second task and the first element and the second element may be grouped into the first subset of system elements 130*a* and the third element may be grouped into the second subset of system elements 130*b* (e.g., where the third element performs a different operation (electronic task) than the first element and/or the second element).

In some embodiments, the system elements 130 may be grouped into the first subset of system elements 130*a* and/or the second subset of system elements 130*b* according to a limitation—such as a power budget constraint. For example, the first chiplet 115 and/or the second chiplet 125 may be individually or collectively limited in an amount of power that may be consumed at a time—such as during a system test.

In some embodiments, the first chiplet 115 may include the first subset of system elements 130*a* and the second chiplet 125 may include the second subset of system elements 130*b*. In these or other embodiments, the first chiplet 115 may include one or more system elements and the second chiplet 125 may include one or more system elements. Alternatively, or additionally, the number of first subset of system elements 130*a* included in the first chiplet 115 and/or the number of second subset of system elements 130*b* may differ based on one or more grouping strategies, as described herein.

In some embodiments, the first chiplet 115 may be individually power controlled at any time—such as during system testing. For example, the first chiplet 115 may be directed to enabled (e.g., operational and/or powered on) at a first time and may be directed to be disabled (e.g., not operational and/or power gated) at a second time, and the second chiplet 125 may be directed to be disabled at the first time and/or may be directed to be enabled at the second time. In these or other embodiments, the operational status (e.g., enabled or disabled) associated with the first chiplet 115 may be modified using the first local controller 110—such as via joint test action group (JTAG) programming. In instances in which the first chiplet 115, the respective individual system elements (e.g., the first subset of system elements 130*a*) associated with the first chiplet 115 may be disabled. In general, operations and/or functions associated with the first local controller 110, the first chiplet 115, and/or the first subset of system elements 130*a* may be similarly applicable to the second local controller 120, the second chiplet 125, and/or the second subset of system elements 130*b*, respectively, unless otherwise indicated. For example, interactions and/or operations between the first local controller 110 and the first chiplet 115 may be the same or similar as interactions and/or operations between the second local controller 120 and the second chiplet 125.

In some embodiments, the first local controller 110 may be communicatively coupled with the first chiplet 115. For example, the first local controller 110 may modify the operational status of the first chiplet 115 (e.g., enabled or disabled), may provide one or more inputs to the first chiplet 115, and/or may receive one or more outputs from the first chiplet 115. In some embodiments, the first local controller 110 may be configured to transmit instructions to the first chiplet 115 that may have been received from the central controller 105. For example, the first local controller 110 may obtain instructions from the central controller 105 and the first local controller 110 may transmit the instructions to the first chiplet 115 and/or may direct the operational state of the first chiplet 115.

In some embodiments, the first local controller 110 may be configured to cause one or more system tests to be performed using the first chiplet 115. For example, the first local controller 110 may transmit instructions that may modify the operational status of the first chiplet 115 and/or the instructions may initiate system testing using the first chiplet 115. In some embodiments, the first local controller 110 may include one or more portions that may be associated with individual system testing operations using the first chiplet 115. For example, a first portion of the first local controller 110 may be configured to direct the performance of a first system test using the first chiplet 115 and a second portion of the first local controller 110 may be configured to direct the performance of a second system test using the first chiplet 115. In some embodiments, the first system test may be a memory test and the second system test may be a logic test, as described herein.

In some embodiments, the central controller 105 may be communicatively coupled with the first local controller 110 and/or the second local controller 120. The central controller 105 may be configured to direct and/or perform operations within the system 100, which may include one or more operations associated with system testing of components of the system 100—such as performing one or more system tests with respect to the first chiplet 115 and/or the second chiplet 125. In some embodiments, the central controller 105 may be configured to direct one or more operations associated with the first chiplet 115 via the first local controller 110. For example, in instances in which the central controller 105 directs system testing to be performed, instructions may be obtained using the first local controller 110 and the first local controller 110 may modify the operational status of the first chiplet 115 and/or the first local controller 110 may provide the instructions to the first chiplet 115 to perform system testing.

In some embodiments, the central controller 105 may be configured to receive results from the first chiplet 115—such as via the first local controller 110. For example, in response to system testing, one or more test results may be obtained by the first local controller 110 by monitoring the behavior of the first chiplet 115 in response to the test image. Alternatively, or additionally, the one or more test results may be obtained using the central controller 105 via the first local controller 110. In some embodiments, the central controller 105 may be configured to determine a performance metric associated with the first chiplet 115 based on the obtained results from system testing. For example, the central controller 105 (and/or the first local controller 110) may compare test results obtained from the first chiplet 115 in response to system testing to an expected behavior and may determine whether the first chiplet 115 may be operating at an expected threshold level of performance. In some embodiments, an expected behavior associated with a response by a particular chiplet to a test image may include an expected response by the particular chiplet.

In some embodiments, the central controller 105 may be configured to maintain a status of the chiplets included in the system 100—such as the first chiplet 115 and/or the second chiplet 125. In instances in which the system 100 includes one or more chiplets that are disabled and/or associated test controllers that are disabled, the central controller 105 may maintain a log of the disabled chiplets and/or controllers, as described herein. For example, the second local controller 120 and the second chiplet 125 may be disabled (e.g., prior to receiving one or more instructions from the central controller 105 to disable the second chiplet 125) and the central controller 105 may obtain and/or log the disabled status of the second local controller 120 and the second chiplet 125.

In some embodiments, the central controller 105 may include code and routines configured to allow one or more computing devices to perform one or more operations. Additionally, or alternatively, the central controller 105 may be implemented using hardware including one or more processors, central processing units (CPUs), graphics processing units (GPUs), data processing units (DPUs), parallel processing units (PPUs), microprocessors (e.g., to perform or control performance of one or more operations), field-programmable gate arrays (FPGA), application-specific integrated circuits (ASICs), accelerators (e.g., deep learning accelerators), and/or other processor types. In some other instances, the central controller 105 may be implemented using a combination of hardware and software. In the present disclosure, operations described as being performed using the central controller 105 may include operations that the central controller 105 may direct a corresponding system to perform.

In instances in which system testing is to be performed with respect to the system 100, the central controller 105 may obtain a test image configured to test individual chiplets included within the system 100. In some embodiments, the test image may include one or more stimuli that may be input into the first chiplet 115. For example, a logical test stimulus and/or a memory test stimulus which may be included in the test image may be provided to the first chiplet 115 via the first local controller 110. Alternatively, or additionally, the test image may include expected behavior relative to the chiplet being tested (e.g., the first chiplet 115 and/or the second chiplet 125) in response to the chiplet receiving and/or processing the stimuli included in the test image. For example, a first expected behavior may be associated with a first stimulus such that upon the first chiplet 115 receiving the first stimulus and generating a first response, the first response may be compared with the first expected behavior included in the test image.

In some embodiments, the system test module 135 of the system 100 may be configured to prepare and/or perform one or more actions relative to one or more components of the system 100 for system testing. For example, the system test module 135 may obtain determinations relative to chiplets and/or local controllers being enabled or disabled, compare targeted chiplets with an enumeration of disabled chiplets, ignore test results for disabled chiplets (e.g., based on a corresponding command or flag), and/or other actions associated with system testing relative to the system 100.

Alternatively, or additionally, the system test module 135 may be configured to administer one or more system tests, such as by distributing the test image to the chiplets (e.g., the first chiplet 115) included in the system 100 via the central controller 105 and/or the local controllers (e.g., the first local controller 110). For example, in response to receiving the test image from the first local controller 110, the first chiplet 115 may generate one or more responses to stimuli included in the test image and the first local controller 110 may obtain test results by monitoring the behavior of the first chiplet 115 and/or one or more components included in the first chiplet 115, which may include or be in addition to the first subset of system elements 130a.

In some embodiments, the system test module 135 may be included in one or more components of the system 100. For example, the system test module 135 may be included in the central controller 105, the first local controller 110, and/or other components not specifically illustrated in the system 100. Alternatively, or additionally, the system test module 135 may be remote from one or more components of the system 100, and the system test module 135 may be configured to communicate with the one or more components of the system 100.

In some embodiments, the system test module 135 may include code and routines configured to allow one or more computing devices to perform one or more operations. Additionally, or alternatively, the system test module 135 may be implemented using hardware including one or more processors, central processing units (CPUs), graphics processing units (GPUs), data processing units (DPUs), parallel processing units (PPUs), microprocessors (e.g., to perform or control performance of one or more operations), field-programmable gate arrays (FPGA), application-specific integrated circuits (ASICs), accelerators (e.g., deep learning accelerators), and/or other processor types. In some other instances, the system test module 135 may be implemented using a combination of hardware and software. In the present disclosure, operations described as being performed using the system test module 135 may include operations that the system test module 135 may direct a corresponding system to perform.

In some embodiments, in response to the system 100 initiating a system test, the central controller 105 may cause one or more chiplets included in the system 100 to be power gated, which may include reducing a current delivered to the chiplet. For example, in response to an initiation of system testing, the central controller 105 may cause the first chiplet 115 and/or the second chiplet 125 to be power gated. In some embodiments, the power gating may cause the chiplet to be powered off. Alternatively, in some embodiments, the power gating may cause the chiplet to be in an intermediate state, such as a standby state, where the chiplet may consume a lesser amount of current than an operational state, but a greater amount of current than a powered off state. In general, power gating the chiplet may cause the chiplets to be disabled relative to an operational state of the chiplet. In some embodiments the central controller 105 may cause multiple chiplets included in the system 100 to be power gated. For example, in response to an initiation of system testing, the central controller 105 may cause both the first chiplet 115 and the second chiplet 125 to be power gated. Additional details related to system testing and power gating of the chiplets may be further discussed herein, such as for example relative to FIG. 2.

In some embodiments, in conjunction with system testing, the central controller 105 may be configured to direct the test image to be distributed to the chiplets included in the system 100, such as the first chiplet 115 and/or the second chiplet 125. Additional details related to distributing the test results may be further discussed herein, such as for example relative to FIG. 3. In some embodiments, in conjunction with system testing, the central controller 105 may be configured to individually distribute the test image to chiplets via the associated local test controller. For example, the central controller 105 may distribute the test image to the first chiplet 115 via the first local controller 110 and upon receiving the test results corresponding to the first chiplet 115, the central controller 105 may distribute the test image to the second chiplet 125 via the second local controller 120. Alternatively, or additionally, in conjunction with system testing, the central controller 105 may be configured to broadcast the test image to one or more chiplets via the associated local test controllers. For example, the central controller 105 may broadcast the test image to the first local controller 110 and/or the second local controller 120 which may distribute the test image to the first chiplet 115 and/or the second chiplet 125, respectively. Additional details related to a broadcast distribution of the test image to one or more chiplets may be further discussed herein, such as for example relative to FIG. 5.

In some embodiments, in response to receiving the test image, the local controllers (e.g., the first local controller 110 and/or the second local controller 120) may obtain test results from the respective chiplets (e.g., the first chiplet 115 and/or the second chiplet 125, respectively) by monitoring the behavior of the respective chiplets in response to the test image. In such instances, the central controller 105 may obtain the test results—such as via the local controllers (e.g., the first local controller 110 and/or the second local controller 120). Additional details related to obtaining the test results may be further discussed herein, such as, for example, relative to FIG. 4. An overview of the system testing process as described herein, which may include one or more functions performed using software at various operations associated with the system testing, may be further discussed at least relative to FIG. 6.

Modifications, additions, or omissions may be made to the system 100 without departing from the scope of the present disclosure. For example, in some embodiments, the system 100 may include any number of chiplets, which may be more or less than the illustrated first chiplet 115 and the second chiplet 125 of FIG. 1. Alternatively, or additionally, the system 100 may be configured to perform any number of tests that may be provided to one or more of the chiplets included in the system (e.g., the illustrated first chiplet 115 and/or the second chiplet 125, and/or any other chiplets that may be included in the system 100). In these or other embodiments, the testing may be such that all of the chiplets are tested or such that a subset of chiplets are tested. Alternatively, or additionally, in some embodiments, the system 100 may include any number of other components, actions, or inputs that may not be explicitly illustrated or described.

FIGS. 2-6 illustrate example operations associated with performing in-system testing, according to one or more embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed using entities may be carried out using hardware, firmware, and/or software. For instance, various functions may be carried out using a processor executing instructions stored in memory.

Figure 2:
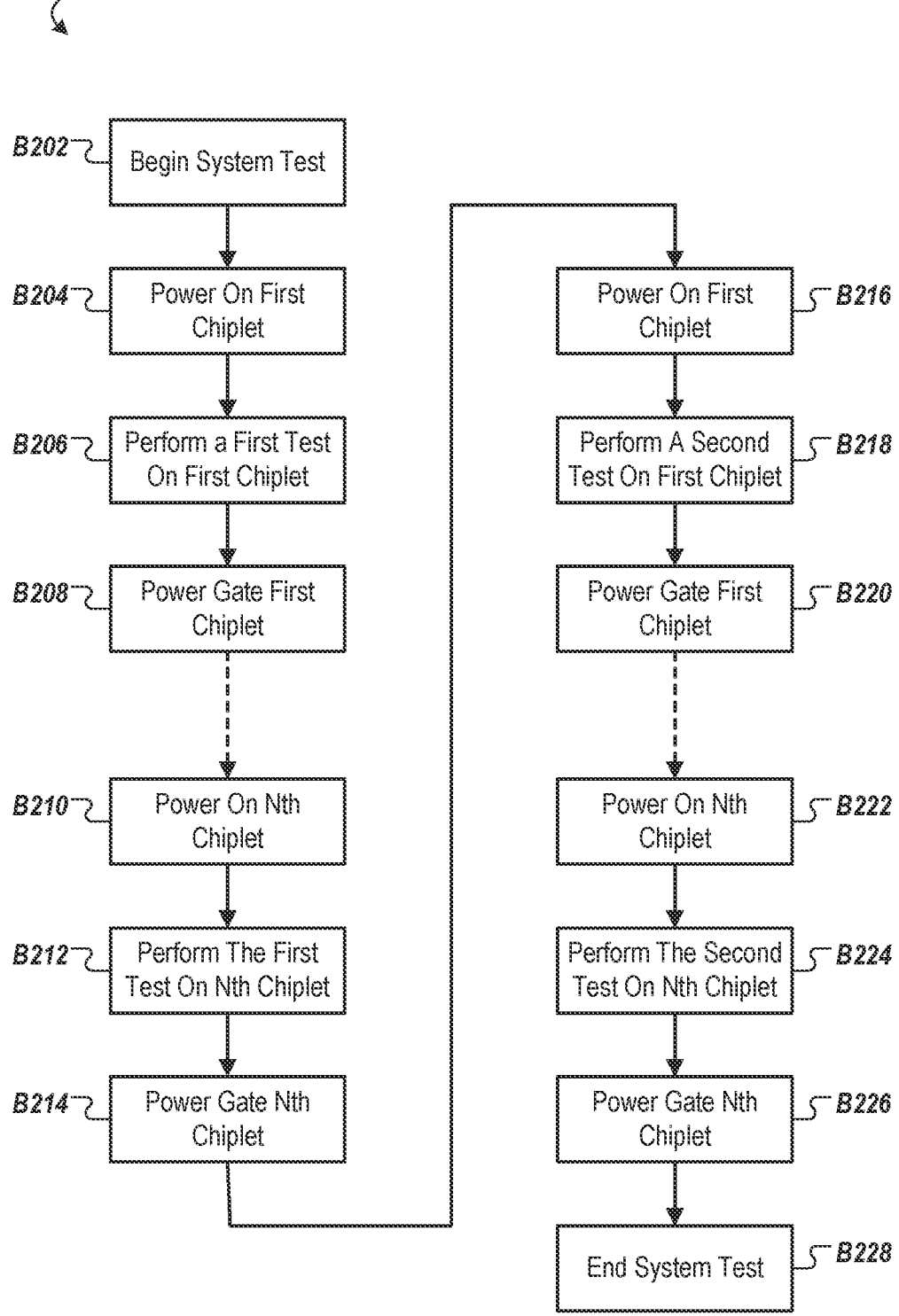
FIGS. 2-6 illustrate example flowcharts associated with performing in-system testing, according to one or more embodiments of the present disclosure.

FIG. 2 illustrates example operations 200 associated with performing in-system testing, according to one or more embodiments of the present disclosure. The operations 200 of FIG. 2 may include a block B202 corresponding to initiating a system test. Block B202 may include a central controller (e.g., the central controller 105 of FIG. 1) directing one or more chiplets (e.g., the first chiplet 115 of FIG. 1) included in a system to be power gated. For example, the central controller may direct one or more local controllers that may be associated with the chiplets (e.g., the first local controller 110 of FIG. 1) to cause the associated chiplet to be power gated. In some embodiments, the local controller may limit or remove a current supplied to the chiplet such that the chiplet may be disabled and/or inoperable.

At block B204, a first chiplet of the one or more chiplets included in the system may be powered on. For example, the first chiplet may have been disabled (e.g., power gated) using the central controller via a first local controller at block B202, and the first chiplet may be enabled (e.g., powered on) using the central controller via the local controller. The first chiplet may be enabled in conjunction with system testing of the first chiplet.

At block B206, a first system test may be performed with respect to the first chiplet. In some embodiments, the central controller may determine whether the first chiplet and/or the associated first local controller is included in a list of disabled chiplets. In instances in which the first chiplet is not included in the list of disabled chiplets, the associated first local controller may obtain a test image for the first system test from the central controller. The test image may include one or more stimuli that may be configured to cause the first chiplet to generate a response, which may be used by the associated first local controller to obtain test results by monitoring the behavior of the first chiplet. In instances in which the first chiplet is included in the list of disabled chiplets, the central controller may not transmit the test image to the associated first local controller. Additional details related to test images being distributed to enabled chiplets and not distributed to disabled chiplets may be further discussed herein, such as, for example, relative to FIG. 3.

As described herein, in response to obtaining the test image, the response of the first chiplet in view of the test image may be monitored by the associated first local controller to obtain the test results. Alternatively, or additionally, in instances in which the first chiplet is included in the list of disabled chiplets, the stimulus associated with the first chiplet may be automatically blocked and an automatic response (e.g., a flag to ignore a response from the first chiplet) may be generated in place of a stimulus response from the disabled first chiplet. In some embodiments, the automatic response may include a completion indication associated with the disabled first chiplet. Additional details related to obtaining test results from enabled chiplets and disabled chiplets may be further discussed herein, such as for example relative to FIG. 4.

As illustrated in FIG. 2, the first system test may be performed on the first chiplet in a first time frame (e.g., block B206) and the first system test may be performed on a second chiplet in a second time frame (e.g., block B212) where the first time frame may not overlap the second time frame (e.g., the system testing may be performed sequentially). In conjunction with the first system test being performed in non-overlapping time frames, the associated test results may similarly be generated in non-overlapping time frames. Alternatively, or additionally, in some embodiments, the first system test may be performed on the first chiplet in the first time frame and the first system test may be performed on the second chiplet in the first time frame (e.g., the system testing may be performed in parallel), and/or the first system test may be performed on the second chiplet in a time frame that may overlap at least a portion of the first time frame associated with the first system test performed on the first chiplet. In some embodiments, the first system test may be a memory test and/or a logic test.

At block B208, the first chiplet may be disabled. In some embodiments, the first local controller may cause the first chiplet to be disabled upon obtaining the test results from the first chiplet. Alternatively, or additionally, the first chiplet may disable itself upon providing the test results to the first local controller.

At blocks B210, B212, and B214, the operations of enabling a particular chiplet, performing the first system test, and disabling the particular chiplet may be performed, which may be the same or similar as described in blocks B204, B206, and B208, respectively. In some embodiments, the blocks B210, B212, and B214 may illustrate that the first system test, and associated enabling and disabling of the chiplet, may be performed for multiple chiplets included in the system. In general, blocks B204, B206, B208, B210, B212, and B214 may illustrate sequential and/or individual operations associated with performing a first system test on two or more chiplets included in a system.

Additionally, blocks B216, B218, B220, B222, B224, and B226 may be the same or similar as blocks B204, B206, B208, B210, B212, and B214, and may be associated with performing a second system test on multiple chiplets included in the system. For example, blocks B204, B206, B208, B210, B212, and B214 may illustrate sequentially enabling individual chiplets, performing a first system test, and disabling the individual chiplets and blocks B216, B218, B220, B222, B224, and B226 may illustrate sequentially enabling individual chiplets, performing a second system test, and disabling the individual chiplets.

At block B228, the central controller may direct system testing to end, which may include directing one or more of the chiplets included in the system to return to a pre-system test state and/or return to pre-system test operations. For example, in instances in which a first chiplet was disabled (e.g., power gated) at the initiation of system testing at block B202, the central controller may direct the first chiplet to be enabled at the end of system testing at block B228. In another example, in instances in which a second chiplet was disabled prior to initiating system testing, the central controller may direct the second chiplet to remain disabled at the end of system testing at block B228.

In these or other embodiments, at the end of system testing, the system may be configured to continue performing non-system testing operations, such as any operations prior to initiating system testing at block B202. Alternatively, in some embodiments, at the end of system testing, the system may be configured to shut down and/or cease operations, which may include system testing operations and/or non-system testing operations.

Modifications, additions, or omissions may be made to the operations 200 without departing from the scope of the present disclosure. For example, in some embodiments, the operations 200 may perform the first test and the second test on a first chiplet before moving onto a second chiplet. For example, a first chiplet may be enabled, a first test may be performed on the first chiplet, a second test may be performed on the first chiplet, and the first chiplet may be disabled. Following the operations associated with the first chiplet, similar operations may be performed on a second chiplet.

In another example, in some embodiments, more than one chiplet may be enabled and/or tested at a time, which may be determined at least relative to a threshold—such as a power budget constraint. For example, a first chiplet and a second chiplet may be enabled, a first test may be performed on the first chiplet and on the second chiplet, and the first chiplet and the second chiplet may be disabled. Following the operations associated with the first chiplet and the second chiplet, similar operations may be performed on additional chiplets, which may be grouped or individual.

In some embodiments, the first chiplet of block B204 may represent two or more replicated chiplets, where the replicated chiplets may be the same as one another. For example, a first chiplet and a second chiplet may be considered replicated chiplets and may individually include a matching subset of system elements. In instances in which the first chiplet of block B204 is a set of replicated chiplets, the central controller may be configured to broadcast the test image to individual chiplets of the replicated chiplets. In some embodiments, one or more chiplets of the replicated chiplets may be disabled, such that the disabled chiplet may be unresponsive to the test image. In instances in which one or more disabled chiplets are included in the replicated chiplets, the central controller may determine which chiplets of the replicated chiplets are disabled and the central controller may be configured to broadcast the test image to the enabled chiplets included in the replicated chiplets, and not broadcast the test image to the disabled chiplets included in the replicated chiplets. Additional details related to distributing a test image to replicate chiplets may be further discussed herein, such as for example relative to FIG. 5.

Alternatively, or additionally, the operations 200 may include any number of other components, actions, or inputs that may not be explicitly illustrated or described.

Figure 3:
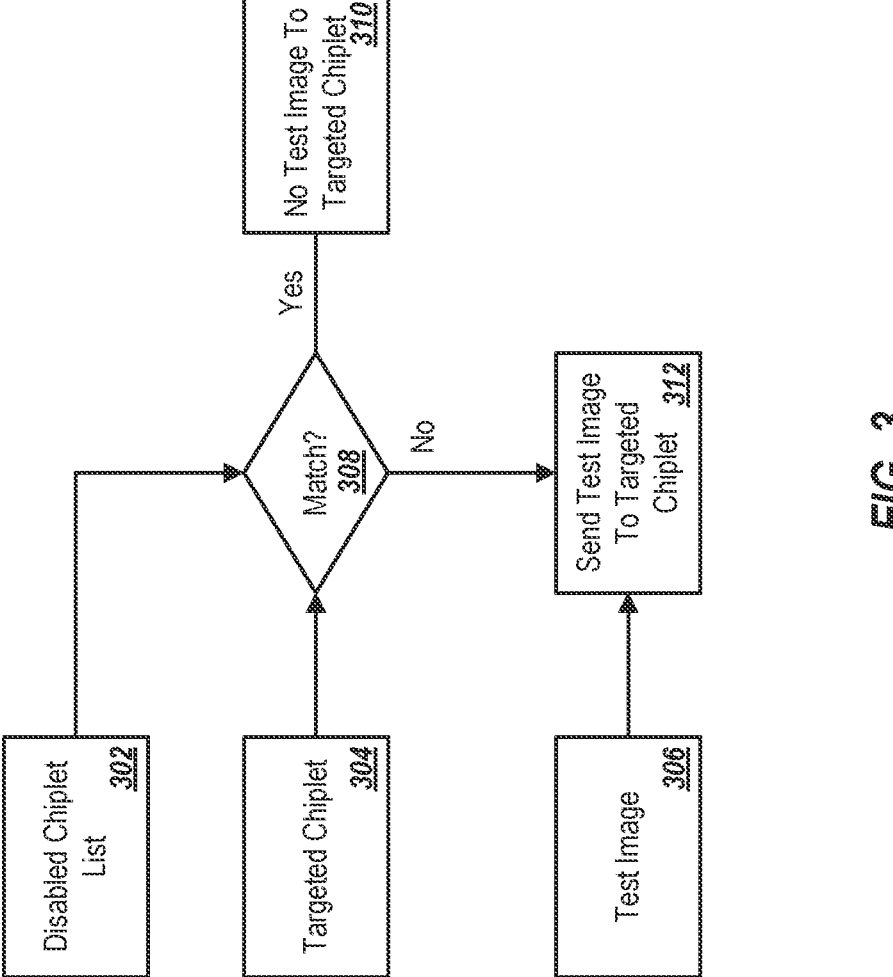
Figure 3:

FIG. 3 illustrates example operations 300 associated with performing in-system testing, according to one or more embodiments of the present disclosure. The operations 300 of FIG. 3 may include obtaining a disabled chiplet list 302 associated with one or more chiplets (e.g., the first chiplet 115 and/or the second chiplet 125 of FIG. 1) included in a system (e.g., the system 100 of FIG. 1). For example, a system may include multiple chiplets where one or more of the multiple chiplets may be disabled and included in the disabled chiplet list 302. In some embodiments, the disabled chiplets in the system may be damaged or may have decreased functionality than an expected functionality. Alternatively, or additionally, the disabled chiplets may be included in the system as a general component and may be disabled as operations and/or functions performed using the system may not utilize the disabled chiplets. In general, the disabled chiplet list 302 may provide an indication of chiplets in the system that may not provide test results upon receiving a test image and/or may cause system testing associated with the system to fail (e.g., by indicating the chiplet may not have passed a system test).

In some embodiments, in conjunction with system testing of the system (and/or chiplets associated with the system), a central controller (e.g., the central controller 105 of FIG. 1) may determine a first chiplet of the chiplets (a "targeted chiplet 304") included in the system to perform system testing. In some embodiments, the central controller may be configured to perform a comparison operation, such as illustrated in block 308, where the targeted chiplet 304 may be compared to chiplets included in the disabled chiplet list 302.

In instances in which the targeted chiplet 304 is included in the disabled chiplet list 302 and as illustrated in block 310, the targeted chiplet 304 may not receive a test image 306. For example, the central controller may not transmit the test image 306 to the targeted chiplet 304. Alternatively, or additionally, the central controller may direct an associated local controller to not provide the test image 306 to the targeted chiplet 304. Alternatively, in instances in which the targeted chiplet 304 is not included in the disabled chiplet list 302 and as illustrated in block 312, the targeted chiplet 304 may obtain the test image 306. For example, the central controller may provide the test image 306 to the targeted chiplet 304 such that the targeted chiplet 304 may perform system testing, as described herein. Alternatively, or additionally, the central controller may direct the local controller to provide the test image 306 to the targeted chiplet 304. In these or other embodiments, the test image 306 may include one or more stimuli that may cause a chiplet to generate one or more test results as part of system testing, as described herein.

Figure 4:
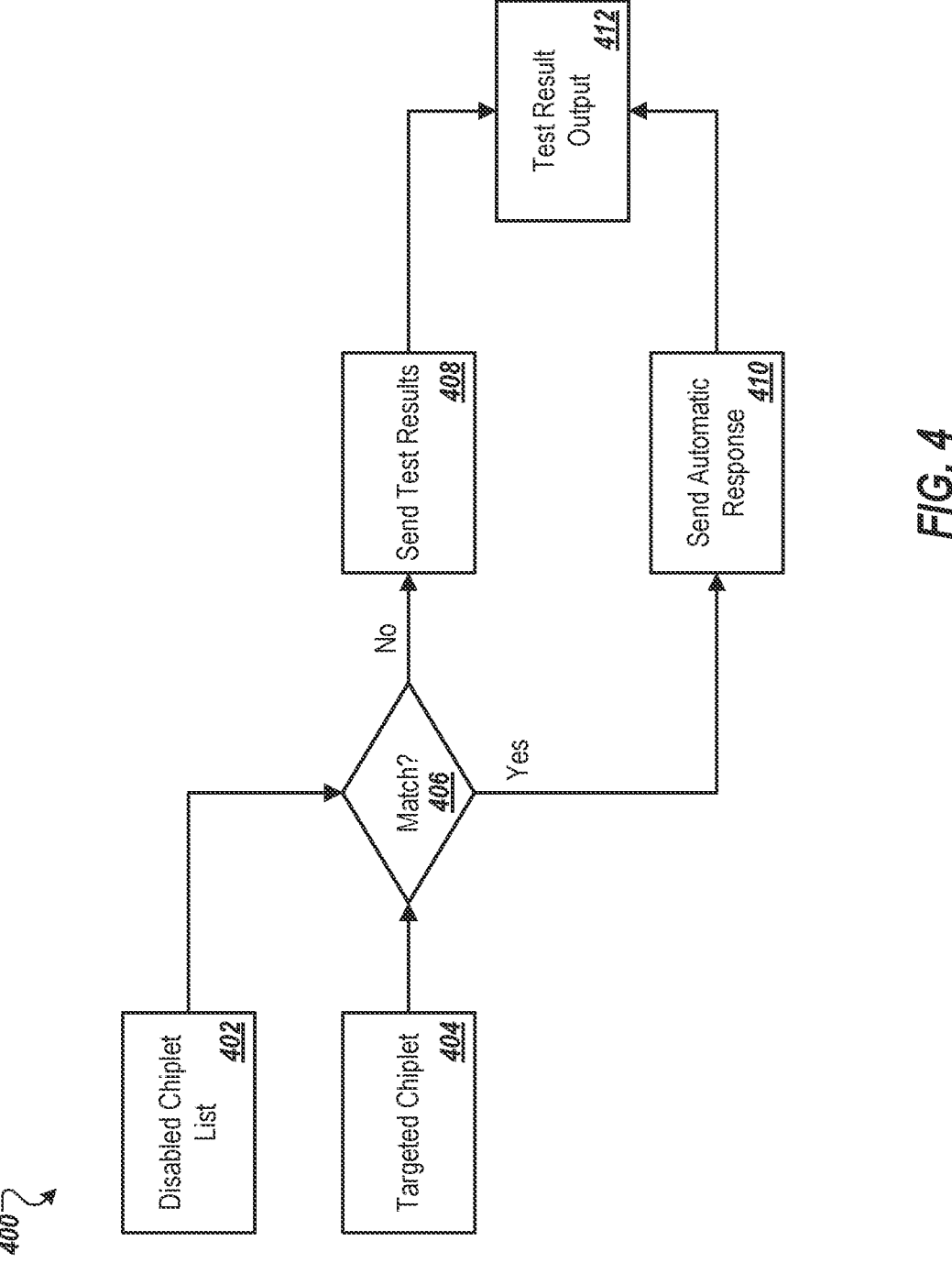

FIG. 4 illustrates example operations 400 associated with performing in-system testing, according to one or more embodiments of the present disclosure. The operations 400 of FIG. 4 may be related to the operations 300 of FIG. 3 in that the operations 400 of FIG. 4 may be associated with test results being obtained from a targeted chiplet in response to receiving a test image as described by the operations 300 of FIG. 3.

Similar to the operations 300 of FIG. 3, a central controller (e.g., the central controller 105 of FIG. 1) may be configured to compare a targeted chiplet 404 with a disabled chiplet list 402, such as illustrated in block 406, to determine whether the targeted chiplet 404 is a disabled chiplet. In instances in which the targeted chiplet 404 is not included in the disabled chiplet list 402, test results 408 from the targeted chiplet 404 may be produced and/or output as the test result output 412. For example, a test image may include one or more stimuli that may cause the targeted chiplet 404 to generate a response, or the test results 408. Alternatively, in instances in which the targeted chiplet 404 is included in the disabled chiplet list 402, the test image associated with a first chiplet included in the disabled chiplet list 402 may be automatically blocked and an automatic response (e.g., a flag to ignore a response from the first chiplet) may be generated and/or sent 410 in place of a stimulus response from the disabled first chiplet.

In these or other embodiments, in conjunction with system testing, the central controller may obtain a test result output 412 from the targeted chiplet. In instances in which the targeted chiplet 404 is included in the disabled chiplet list 402, the test result output 412 obtained using the central controller may be the automatic response 410, which may also include a completion indication. Alternatively, instances in which the targeted chiplet 404 is not included in the disabled chiplet list 402, the test result output 412 obtained using the central controller may be the sent test results 408 from the targeted chiplet 404. As such, the system performing the system testing may be enabled to continue system testing as the targeted chiplet 404 (whether enabled or disabled) may produce a test result output 412. For example, in instances in which a targeted chiplet 404 fails to produce the test result output 412, the system testing may indicate an error with the targeted chiplet 404 and may halt or discontinue system testing.

Figure 5:
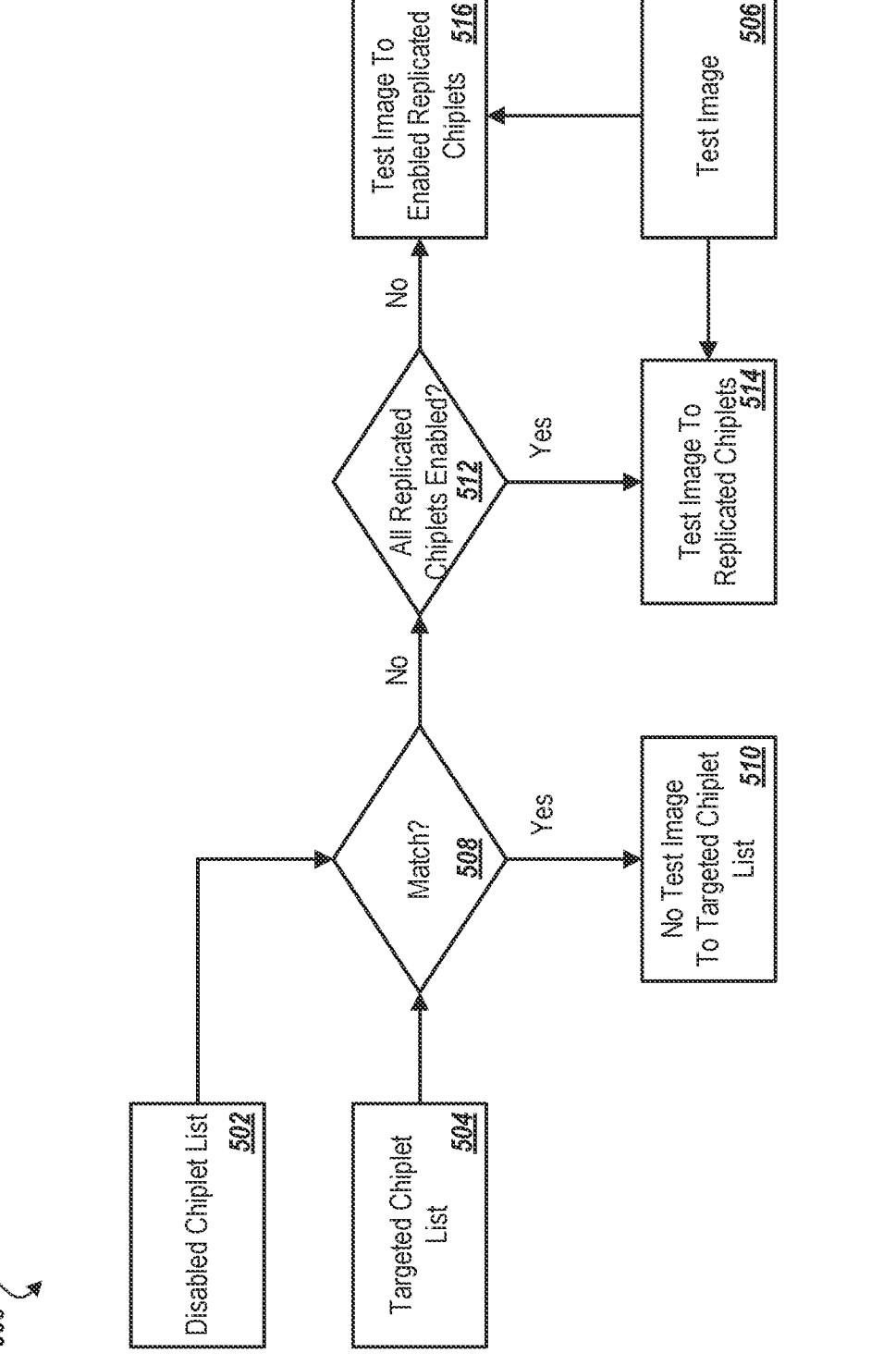

FIG. 5 illustrates example operations 500 associated with performing in-system testing, according to one or more embodiments of the present disclosure. The operations 500 of FIG. 5 may be related to the operations 300 of FIG. 3 in that the operations 500 of FIG. 5 may be directed to distributing a test image to one or more targeted replicated chiplets and not distributing the test image to one or more disabled chiplets.

Similar to the operations 300 of FIG. 3, a central controller (e.g., the central controller 105 of FIG. 1) may be configured to compare a targeted chiplet list 504 with a disabled chiplet list 502, such as illustrated in block 508, to determine whether the targeted chiplet list 504 includes one or more disabled chiplets. The handling of the targeted chiplet list 504, including the transmission of a test image 506 and obtaining test results is addressed at least with respect to the operations 300 of FIG. 3 and/or the operations 400 of FIG. 4, respectively.

In some embodiments, a system (e.g., the system 100 of FIG. 1) may include two or more chiplets that may be the same as one another. For example, a first chiplet and a second chiplet may be considered replicated chiplets and may individually include a matching subset of system elements, as described herein. In instances in which the system includes replicated chiplets that are operating as expected (e.g., without faults and/or failures) and a test image, including one or more stimuli, is provided to the replicated chiplets, the replicated chiplets may generate substantially similar test results.

In some embodiments, in instances in which the system initiates system testing, the test image may be broadcast to the replicated chiplets. In some embodiments, test results associated with individual chiplets of the replicated chiplets may be obtained sequentially (e.g., similar to system testing, such as described relative to FIG. 2). Alternatively, or additionally, in some embodiments, the replicated chiplets may be tested in parallel and the central controller of the system may obtain the test results from the individual chiplets of the replicated chiplets. In these or other embodiments, the system testing operations of the replicated chiplets (e.g., sequential, parallel, or a combination of both) may be performed in view of a threshold associated with the system—such as a power budget constraint. For example, in instances in which a system includes six replicated chiplets and a power budget constraint that limits system testing of the replicated chiplets to three or less, the system may apply the test image and obtain results from a first subset of three replicated chiplets and subsequently may apply the test image and obtain results from a second subset of three replicated chiplets, where both parallel and sequential operations may be performed. The prior is given as an example only where the number of replicated chiplets in a system may vary, the grouping according to a threshold may vary, and/or the threshold type may vary (e.g., the threshold may be based on one or more factors which may or may not include a power budget).

Returning to FIG. 5, in instances in which the targeted chiplet list 504 includes one or more chiplets included in the disabled chiplet list 502 and as illustrated in block 510, no test image may be transmitted to and/or obtained by the chiplets included in the targeted chiplet list 504. Alternatively, or additionally, in instances in which no chiplets in the target chiplet list 504 are included in the disabled chiplet list 502, the replicated chiplets included in the targeted chiplet list 504 may be considered to determine if all of the replicated chiplets may be enabled, such as illustrated in block 512. In instances in which all of the replicated chiplets of the targeted chiplet list 504 are enabled (e.g., the "Yes" path at block 512), the central controller may be configured to broadcast the test image 506 to the individual chiplets included in the replicated chiplets (e.g., included in the targeted chiplet list 504). For example, the central controller may broadcast the test image 506 to a local controller associated with individual chiplets included in the replicated chiplets.

In instances in which one or more individual chiplets of the replicated chiplets are disabled, the central controller may be configured to identify one or more disabled chiplets included in the replicated chiplets, and the central controller may be configured to broadcast the test image 506 to the enabled replicated chiplets, as illustrated in block 516. In conjunction with the broadcast of the test image 506 to the replicated chiplets (e.g., the replicated chiplets included in the targeted chiplet list 504), the central controller may not distribute the test image 506 to the disabled chiplets included in the replicated chiplets. For example, the central controller may remove the disabled replicated chiplets from the recipients of the test image 506 (e.g., the replicated chiplets) such that the test image 506 may not be provided to the disabled replicated chiplets of the replicated chiplets. Alternatively, or additionally, the central controller may direct a local controller associated with the disabled replicated chiplets to not provide the test image 506 to the disabled replicated chiplets. For example, the central controller may broadcast the test image 506 to the replicated chiplets (e.g., which may include disabled replicated chiplets) and based on identifying one or more disabled replicated chiplets, the central controller may direct the associated local controller of the disabled replicated chiplets to not provide the test image 506 to the disabled replicated chiplets. Alternatively, the local controllers associated with the disabled replicated chiplets may be configured to not provide the test image 506 to the associated disabled replicated chiplet.

In instances in which the targeted chiplet list 504 includes one or more chiplets that are not replicated chiplets, the operations 500 may be the same or similar as the operations 300 of FIG. 3, which may include not sending test images to a chiplet that is included in the disabled chiplet list 502, similar to the function described relative to block 310 of FIG. 3.

Figure 6:

FIG. 6 illustrates example operations 600 associated with performing in-system testing, according to one or more embodiments of the present disclosure. In some embodiments, the operations 600 may provide a general overview of the performance of in-system testing, which may include operations, functions, and the like as described relative to other figures and descriptions included herein.

In some embodiments, the operations 600 may begin at block B602, where a system (e.g., the system 100 of FIG. 1)

may power on. In conjunction with powering on, one or more chiplets (e.g., the first chiplet 115 and/or the second chiplet 125) included in the system may power on. Alternatively, or additionally, in instances in which one or more chiplets included in the system are disabled, the disabled chiplets may not power on.

At block B604, the system may be configured to determine individual chiplets included in the system that may be disabled. In some embodiments, the system may use a system test module (e.g., the system test module 135 of FIG. 1) to determine the status of chiplets included therein. In response to determining the status of the chiplets, including determining a list of disabled chiplets included in the system, at block B604, the system may provide the list of disabled chiplets to a central controller (e.g., the central controller 105 of FIG. 1).

In some embodiments, at block B608, the central controller may be configured to perform system testing on the system. In some embodiments, performing system testing may include the central controller determining if a targeted chiplet and/or the associated targeted local controller is included in a list of disabled chiplets, such as comparing the targeted chiplet to the list of disabled chiplets obtained at block B606. In instances in which the targeted chiplet is not included in the list of disabled chiplets, the associated target local controller may obtain a test image from the central controller. The test image may include one or more stimuli that may be configured to cause the targeted chiplet to generate a response, which may be used by the associated targeted local controller to obtain test results by monitoring the behavior of the targeted chiplet. In some embodiments, the test results may be used in a verification of the performance of the targeted chiplet, such as at block B614 herein. In instances in which the targeted chiplet is included in the list of disabled chiplets, the central controller may not transmit the test image to the associated targeted local controller. Additional details related to test images being distributed to enabled chiplets and not distributed to disabled chiplets may be further discussed herein, such as for example relative to FIG. 3.

As described herein, in response to obtaining the test image, the response of the targeted chiplet in view of the test image may be monitored by the associated targeted local controller to obtain the test results. Alternatively, or additionally, in instances in which the targeted chiplet is included in the list of disabled chiplets, the central controller may be configured to obtain an automatic response and/or a completion indication associated with a targeted disabled chiplet. Additional details related to obtaining test results from enabled chiplets and disabled chiplets may be further discussed herein, such as for example relative to FIG. 4.

In some embodiments, performing the system testing at block B608 may include broadcasting the test image to two or more replicated chiplets, where the replicated chiplets may be the same as one another. For example, a first chiplet and a second chiplet may be considered replicated chiplets and may individually include a matching subset of system elements. In instances in which the system testing is performed on a set of replicated chiplets, the central controller may be configured to broadcast the test image to individual chiplets of the replicated chiplets. In some embodiments, one or more chiplets of the replicated chiplets may be disabled, such that the disabled chiplet may be unresponsive to the test image. In instances in which one or more disabled chiplets are included in the replicated chiplets, the central controller may determine which chiplets of the replicated chiplets are disabled and the central controller may be configured to broadcast the test image to the enabled chiplets included in the replicated chiplets, and not broadcast the test image to the disabled chiplets included in the replicated chiplets. Additional details related to distributing a test image to replicate chiplets may be further discussed herein, such as for example relative to FIG. 5.

At block B610, a verification of the test results of the system testing may be performed. In some embodiments, the verification may be performed using the central controller. Alternatively, or additionally, the verification may be performed using the system and/or components of the system, such as a verification software module or other component configured to compare obtained test results with expected test results. Blocks B612, B614, and B616 may further illustrate the process of verifying the test results of system testing.

In general, the description of the verification of the test results may be described as the system performing the verification. It will be appreciated that other systems, subsystems, or components of the system may be configured to perform the verification of the test results, such as the central controller, among others.

At block B612, the system may compare a first selected chiplet of the chiplets included in the system to chiplets included in the disabled chiplet list. In instances in which the first selected chiplet is included in the disabled chiplet list, the system may proceed to block B616. In instances in which the first selected chiplet is not included in the disabled chiplet list, the system may proceed to block B614.

At block B614, the system may compare test results associated with the chiplet with expected test results. For example, a test image may include one or more stimuli that when provided to a chiplet, may cause one or more responses to the stimuli. Further, a test image may include an expected result that may be generated in response to the stimuli. In some embodiments, the responses of the chiplet to the stimuli may produce the test results. In some embodiments, the results of the comparison from block B614 may be used to determine whether the system and/or the chiplets included in the system are functioning as expected, and/or whether there may be one or more issues included therein. In some embodiments, the results of the verification may be processed using the system, one or more components of the system, a second system, and/or other processing systems or devices.

At block B616, a determination may be performed as to whether additional chiplets included in the system may be verified or whether all of the chiplets included in the system have been verified. In instances in which not all of the chiplets included in the system have been verified, the system may proceed to block B612. Alternatively, in instances in which all of the chiplets included in the system have been verified, the system may proceed to block B618.

At block B618, the system may power off. The system may power off at any point (or any amount of time) after completing the verification of the test results of the chiplets included in the system.

Figure 7:
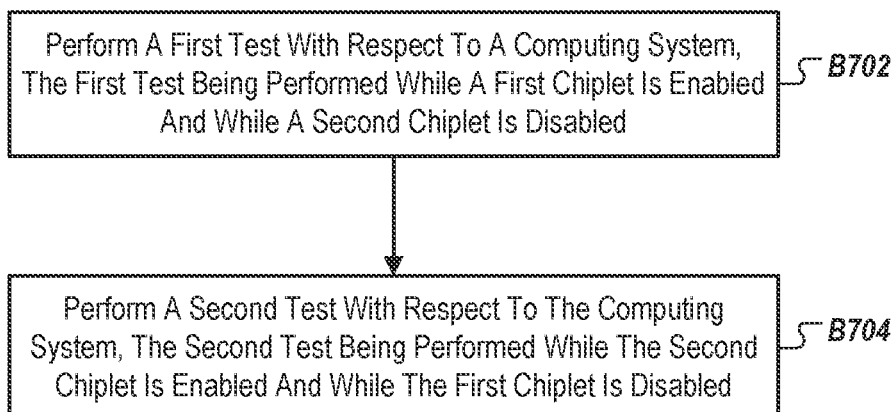
FIG. 7 illustrates a method for performing in-system testing, according to one or more embodiments of the present disclosure.

FIG. 7 illustrates an example method 700 for in-system testing, according to one or more embodiments of the present disclosure. Each block of method 700, described herein, may comprise a computing process that may be performed using any combination of hardware, firmware, and/or software. For instance, various functions may be carried out by a processor executing instructions stored in memory. The method 700 may also be embodied as computer-usable instructions stored on computer storage media. The method 700 may be provided by a standalone application, a service or hosted service (standalone or in combination with another hosted service), or a plug-in to another product, to name a few. In addition, the method 700 is described, by way of example, with respect to the system of FIG. 1. However, these methods may additionally or alternatively be executed by any one system, or any combination of systems, including, but not limited to, those described herein. In these or other embodiments, one or more operations of the method 700 may be performed by one or more computing devices, such as that described in further detail below with respect to FIG. 9.

The method 700 may include a block B702 where a first test may be performed with respect to a computing system. In some embodiments, the first test may be performed while a first chiplet of the computing system may be enabled and/or while a second chiplet of the computing system may be disabled. In some embodiments, the first chiplet may include a first subset of one or more system elements of the computing system and the second chiplet may include a second subset of one or more system elements of the computing system.

At block B704, a second test may be performed with respect to the computing system. In some embodiments, the second test may be performed while the second chiplet may be enabled and/or while the first chiplet may be disabled. In some embodiments, the first test and the second test may use a same test image. In some embodiments, the test image may correspond to the computing system as a whole. In some embodiments, the first test and/or the second test may include one or more of a logic test and/or a memory test.

In some embodiments, the first chiplet may be enabled and/or the second chiplet may be disabled in response to a power budget constraint that may be associated with the computing system. For example, a power budget constraint may introduce a power consumption amount which may be achieved with the first chiplet enabled and the second chiplet disabled and/or the first chiplet disabled and the second chiplet enabled.

In some embodiments, in instances in which the first chiplet is disabled and/or the second chiplet is disabled, the disabling of a chiplet may be caused by power gating the chiplet. In some embodiments, power gating a chiplet may include adjusting a current delivered to the chiplet, such that the chiplet may be disabled.

Modifications, additions, or omissions may be made to the method 700 without departing from the scope of the present disclosure. For example, in instances in which the first chiplet is disabled during the second test, an automatic response and/or a completion indication for the first chiplet may be generated. The automatic response may include a flag or notification to the system that any response from the first chiplet may be ignored. Alternatively, or additionally, the automatic response may include a completion indication associated with the first chiplet. In another example, in instances in which the second chiplet is disabled during the first test, an automatic response and/or a completion indication for the second chiplet may be generated.

Although illustrated as discrete blocks, various blocks of the method 700 may be divided into additional blocks, combined into fewer blocks, or eliminated, depending on the desired implementation.

Example Autonomous Vehicle

Figure 8A:
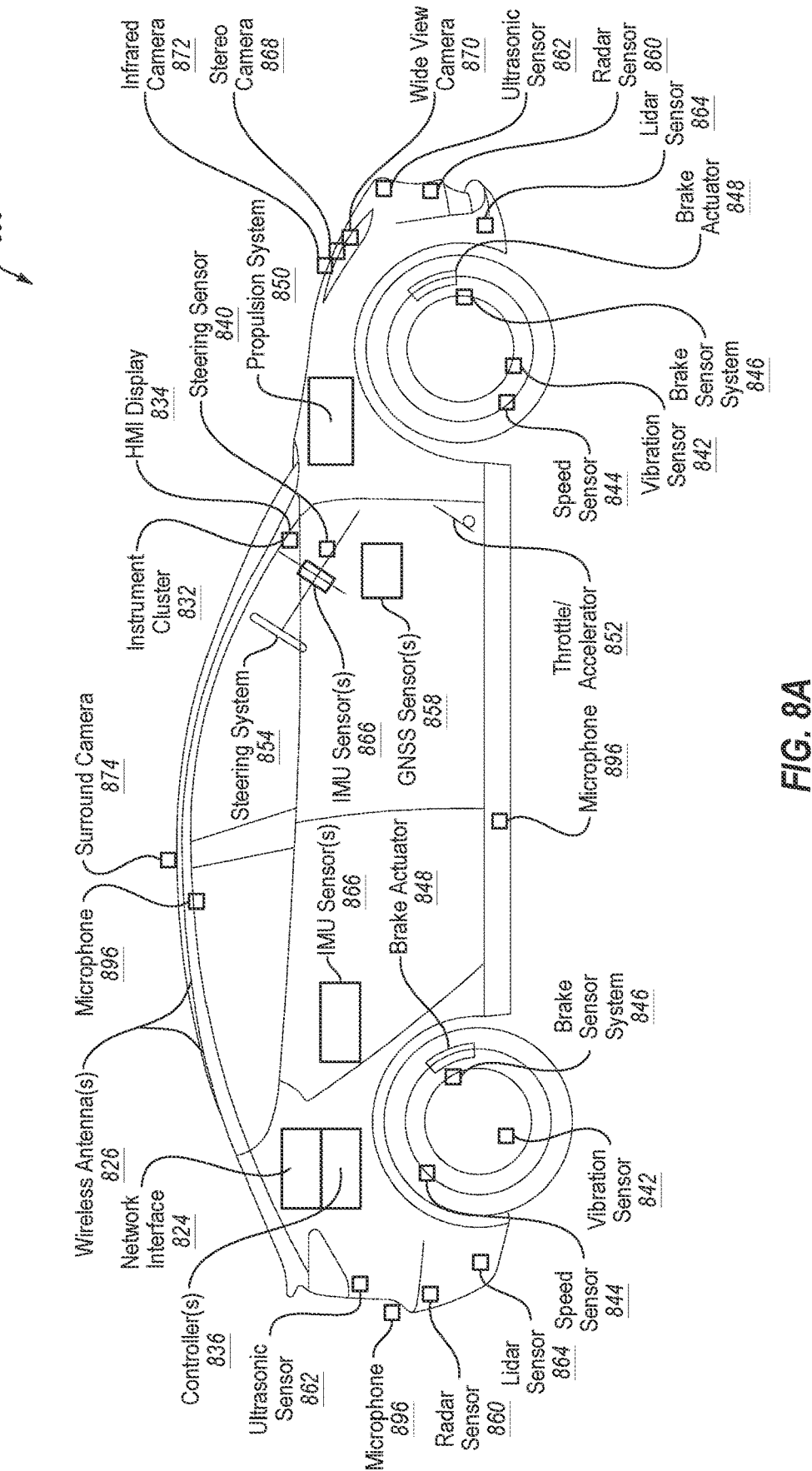
FIG. 8A is an illustration of an example autonomous vehicle, in accordance with some embodiments of the present disclosure.

FIG. 8A is an illustration of an example autonomous vehicle 800, in accordance with some embodiments of the present disclosure. The autonomous vehicle 800 (alternatively referred to herein as the "vehicle 800") may include, without limitation, a passenger vehicle, such as a car, a truck, a bus, a first responder vehicle, a shuttle, an electric or motorized bicycle, a motorcycle, a fire truck, a police vehicle, an ambulance, a boat, a construction vehicle, an underwater craft, a drone, and/or another type of vehicle (e.g., that is unmanned and/or that accommodates one or more passengers). Autonomous vehicles are generally described in terms of automation levels, defined by the National Highway Traffic Safety Administration (NHTSA), a division of the US Department of Transportation, and the Society of Automotive Engineers (SAE) "Taxonomy and Definitions for Terms Related to Driving Automation Systems for On-Road Motor Vehicles" (Standard No. J3016-201806, published on Jun. 15, 2018, Standard No. J3016-201609, published on Sep. 30, 2016, and previous and future versions of this standard). The vehicle 800 may be capable of functionality in accordance with one or more of Level 3-Level 5 of the autonomous driving levels. For example, the vehicle 800 may be capable of conditional automation (Level 3), high automation (Level 4), and/or full automation (Level 5), depending on the embodiment.

The vehicle 800 may include components such as a chassis, a vehicle body, wheels (e.g., 2, 4, 6, 8, 18, etc.), tires, axles, and other components of a vehicle. The vehicle 800 may include a propulsion system 850, such as an internal combustion engine, hybrid electric power plant, an all-electric engine, and/or another propulsion system type. The propulsion system 850 may be connected to a drive train of the vehicle 800, which may include a transmission, to enable the propulsion of the vehicle 800. The propulsion system 850 may be controlled in response to receiving signals from the throttle/accelerator 852.

A steering system 854, which may include a steering wheel, may be used to steer the vehicle 800 (e.g., along a desired path or route) when the propulsion system 850 is operating (e.g., when the vehicle is in motion). The steering system 854 may receive signals from a steering actuator 856. The steering wheel may be optional for full automation (Level 5) functionality.

The brake sensor system 846 may be used to operate the vehicle brakes in response to receiving signals from the brake actuators 848 and/or brake sensors.

Controller(s) 836, which may include one or more CPU(s), system on chips (SoCs) 804 (FIG. 8C) and/or GPU(s), may provide signals (e.g., representative of commands) to one or more components and/or systems of the vehicle 800. For example, the controller(s) may send signals to operate the vehicle brakes via one or more brake actuators 848, to operate the steering system 854 via one or more steering actuators 856, and/or to operate the propulsion system 850 via one or more throttle/accelerators 852. The controller(s) 836 may include one or more onboard (e.g., integrated) computing devices (e.g., supercomputers) that process sensor signals, and output operation commands (e.g., signals representing commands) to enable autonomous driving and/or to assist a human driver in driving the vehicle 800. The controller(s) 836 may include a first controller 836 for autonomous driving functions, a second controller 836 for functional safety functions, a third controller 836 for artificial intelligence functionality (e.g., computer vision), a fourth controller 836 for infotainment functionality, a fifth controller 836 for redundancy in emergency conditions, and/or other controllers. In some examples, a single controller 836 may handle two or more of the above functionalities, two or more controllers 836 may handle a single functionality, and/or any combination thereof.

The controller(s) 836 may provide the signals for controlling one or more components and/or systems of the vehicle 800 in response to sensor data received from one or more sensors (e.g., sensor inputs). The sensor data may be received from, for example and without limitation, global navigation satellite systems sensor(s) 858 (e.g., Global Positioning System sensor(s)), RADAR sensor(s) 860, ultrasonic sensor(s) 862, LIDAR sensor(s) 864, inertial measurement unit (IMU) sensor(s) 866 (e.g., accelerometer(s), gyroscope(s), magnetic compass(es), magnetometer(s), etc.), microphone(s) 896, stereo camera(s) 868, wide-view camera(s) 870 (e.g., fisheye cameras), infrared camera(s) 872, surround camera(s) 874 (e.g., 360 degree cameras), long-range and/or mid-range camera(s) 898, speed sensor(s) 844 (e.g., for measuring the speed of the vehicle 800), vibration sensor(s) 842, steering sensor(s) 840, brake sensor(s) 846 (e.g., as part of the brake sensor system 846), and/or other sensor types.

One or more of the controller(s) 836 may receive inputs (e.g., represented by input data) from an instrument cluster 832 of the vehicle 800 and provide outputs (e.g., represented by output data, display data, etc.) via a human-machine interface (HMI) display 834, an audible annunciator, a loudspeaker, and/or via other components of the vehicle 800. The outputs may include information such as vehicle velocity, speed, time, map data (e.g., the HD map 822 of FIG. 8C), location data (e.g., the location of the vehicle 800, such as on a map), direction, location of other vehicles (e.g., an occupancy grid), information about objects and status of objects as perceived by the controller(s) 836, etc. For example, the HMI display 834 may display information about the presence of one or more objects (e.g., a street sign, caution sign, traffic light changing, etc.), and/or information about driving maneuvers the vehicle has made, is making, or will make (e.g., changing lanes now, taking exit 34B in two miles, etc.).

The vehicle 800 further includes a network interface 824, which may use one or more wireless antenna(s) 826 and/or modem(s) to communicate over one or more networks. For example, the network interface 824 may be capable of communication over LTE, WCDMA, UMTS, GSM, CDMA2000, etc. The wireless antenna(s) 826 may also enable communication between objects in the environment (e.g., vehicles, mobile devices, etc.), using local area network(s), such as Bluetooth, Bluetooth LE, Z-Wave, ZigBee, etc., and/or low power wide-area network(s) (LPWANs), such as LoRaWAN, SigFox, etc.

Figure 8B:
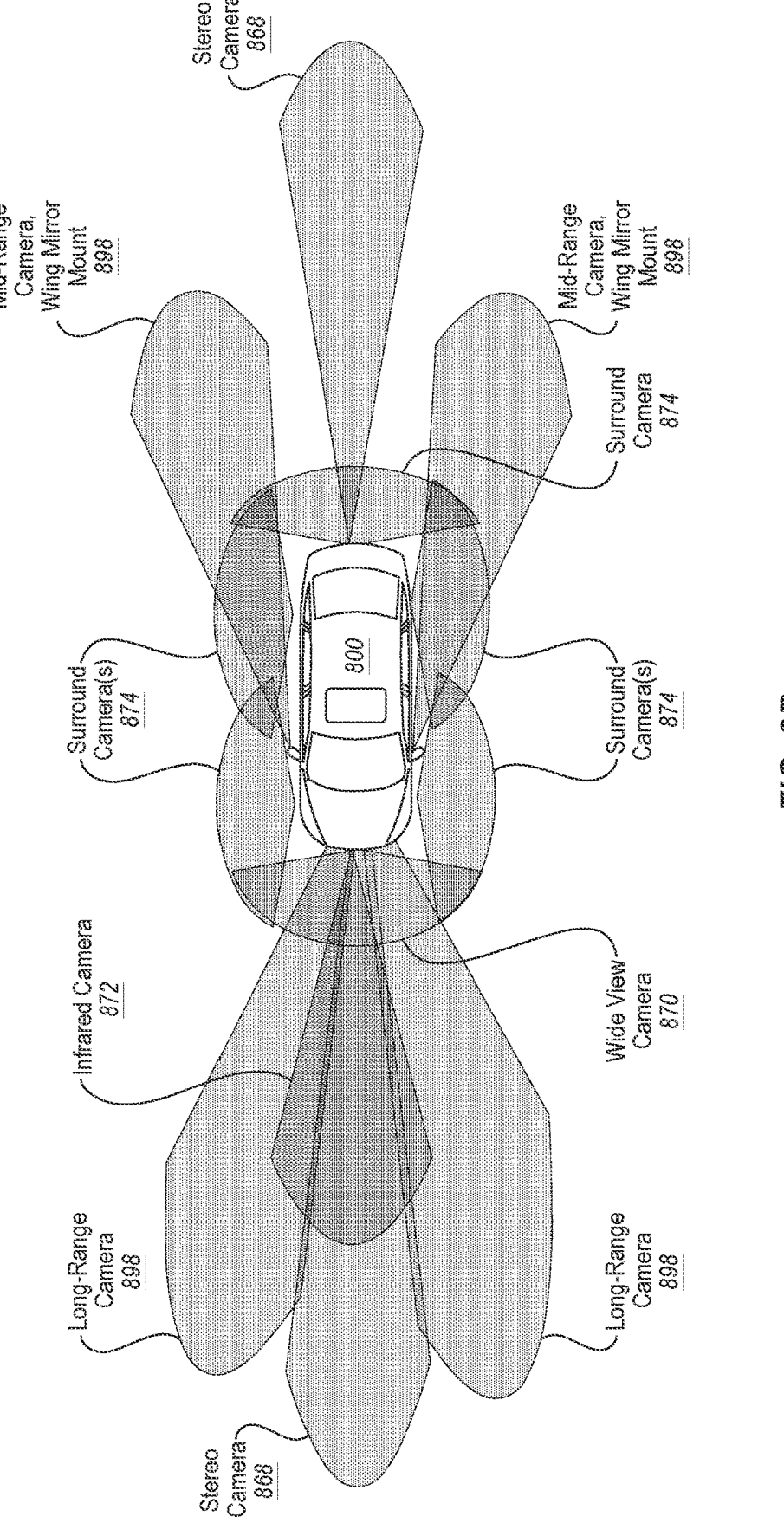
FIG. 8B is an example of camera locations and fields of view for the example autonomous vehicle of FIG. 8A, in accordance with some embodiments of the present disclosure.

FIG. 8B is an example of camera locations and fields of view for the example autonomous vehicle 800 of FIG. 8A, in accordance with some embodiments of the present disclosure. The cameras and respective fields of view are one example embodiment and are not intended to be limiting. For example, additional and/or alternative cameras may be included and/or the cameras may be located at different locations on the vehicle 800.

The camera types for the cameras may include, but are not limited to, digital cameras that may be adapted for use with the components and/or systems of the vehicle 800. The camera(s) may operate at automotive safety integrity level (ASIL) B and/or at another ASIL. The camera types may be capable of any image capture rate, such as 60 frames per second (fps), 120 fps, 240 fps, etc., depending on the embodiment. The cameras may be capable of using rolling shutters, global shutters, another type of shutter, or a combination thereof. In some examples, the color filter array may include a red clear clear clear (RCCC) color filter array, a red clear clear blue (RCCB) color filter array, a red blue green clear (RBGC) color filter array, a Foveon X3 color filter array, a Bayer sensors (RGGB) color filter array, a monochrome sensor color filter array, and/or another type of color filter array. In some embodiments, clear pixel cameras, such as cameras with an RCCC, an RCCB, and/or an RBGC color filter array, may be used in an effort to increase light sensitivity.

In some examples, one or more of the camera(s) may be used to perform advanced driver assistance systems (ADAS) functions (e.g., as part of a redundant or fail-safe design). For example, a Multi-Function Mono Camera may be installed to provide functions including lane departure warning, traffic sign assist and intelligent headlamp control. One or more of the camera(s) (e.g., all of the cameras) may record and provide image data (e.g., video) simultaneously.

One or more of the cameras may be mounted in a mounting assembly, such as a custom-designed (3-D printed) assembly, in order to cut out stray light and reflections from within the car (e.g., reflections from the dashboard reflected in the windshield mirrors) which may interfere with the camera's image data capture abilities. With reference to wing-mirror mounting assemblies, the wing-mirror assemblies may be custom 3-D printed so that the camera mounting plate matches the shape of the wing-mirror. In some examples, the camera(s) may be integrated into the wing-mirror. For side-view cameras, the camera(s) may also be integrated within the four pillars at each corner of the cabin.

Cameras with a field of view that includes portions of the environment in front of the vehicle 800 (e.g., front-facing cameras) may be used for surround view, to help identify forward-facing paths and obstacles, as well aid in, with the help of one or more controllers 836 and/or control SoCs, providing information critical to generating an occupancy grid and/or determining the preferred vehicle paths. Front-facing cameras may be used to perform many of the same ADAS functions as LIDAR, including emergency braking, pedestrian detection, and collision avoidance. Front-facing cameras may also be used for ADAS functions and systems including Lane Departure Warnings (LDW), Autonomous Cruise Control (ACC), and/or other functions such as traffic sign recognition.

A variety of cameras may be used in a front-facing configuration, including, for example, a monocular camera platform that includes a CMOS (complementary metal oxide semiconductor) color imager. Another example may be a wide-view camera(s) 870 that may be used to perceive objects coming into view from the periphery (e.g., pedestrians, crossing traffic or bicycles). Although only one wide-view camera is illustrated in FIG. 8B, there may any number of wide-view cameras 870 on the vehicle 800. In addition, long-range camera(s) 898 (e.g., a long-view stereo camera pair) may be used for depth-based object detection, especially for objects for which a neural network has not yet been trained. The long-range camera(s) 898 may also be used for object detection and classification, as well as basic object tracking.

One or more stereo cameras 868 may also be included in a front-facing configuration. The stereo camera(s) 868 may include an integrated control unit comprising a scalable processing unit, which may provide a programmable logic (e.g., FPGA) and a multi-core micro-processor with an integrated CAN or Ethernet interface on a single chip. Such a unit may be used to generate a 3-D map of the vehicle's environment, including a distance estimate for all the points in the image. An alternative stereo camera(s) 868 may include a compact stereo vision sensor(s) that may include two camera lenses (one each on the left and right) and an image processing chip that may measure the distance from the vehicle to the target object and use the generated information (e.g., metadata) to activate the autonomous emergency braking and lane departure warning functions. Other types of stereo camera(s) 868 may be used in addition to, or alternatively from, those described herein.

Cameras with a field of view that includes portions of the environment to the side of the vehicle 800 (e.g., side-view cameras) may be used for surround view, providing information used to create and update the occupancy grid, as well as to generate side impact collision warnings. For example, surround camera(s) 874 (e.g., four surround cameras 874 as illustrated in FIG. 8B) may be positioned around the vehicle 800. The surround camera(s) 874 may include wide-view camera(s) 870, fisheye camera(s), 360-degree camera(s), and/or the like. For example, four fisheye cameras may be positioned on the vehicle's front, rear, and sides. In an alternative arrangement, the vehicle may use three surround camera(s) 874 (e.g., left, right, and rear), and may leverage one or more other camera(s) (e.g., a forward-facing camera) as a fourth surround-view camera.

Cameras with a field of view that include portions of the environment to the rear of the vehicle 800 (e.g., rear-view cameras) may be used for park assistance, surround view, rear collision warnings, and creating and updating the occupancy grid. A wide variety of cameras may be used including, but not limited to, cameras that are also suitable as a front-facing camera(s) (e.g., long-range and/or mid-range camera(s) 898, stereo camera(s) 868), infrared camera(s) 872, etc.), as described herein.

Figure 8C:
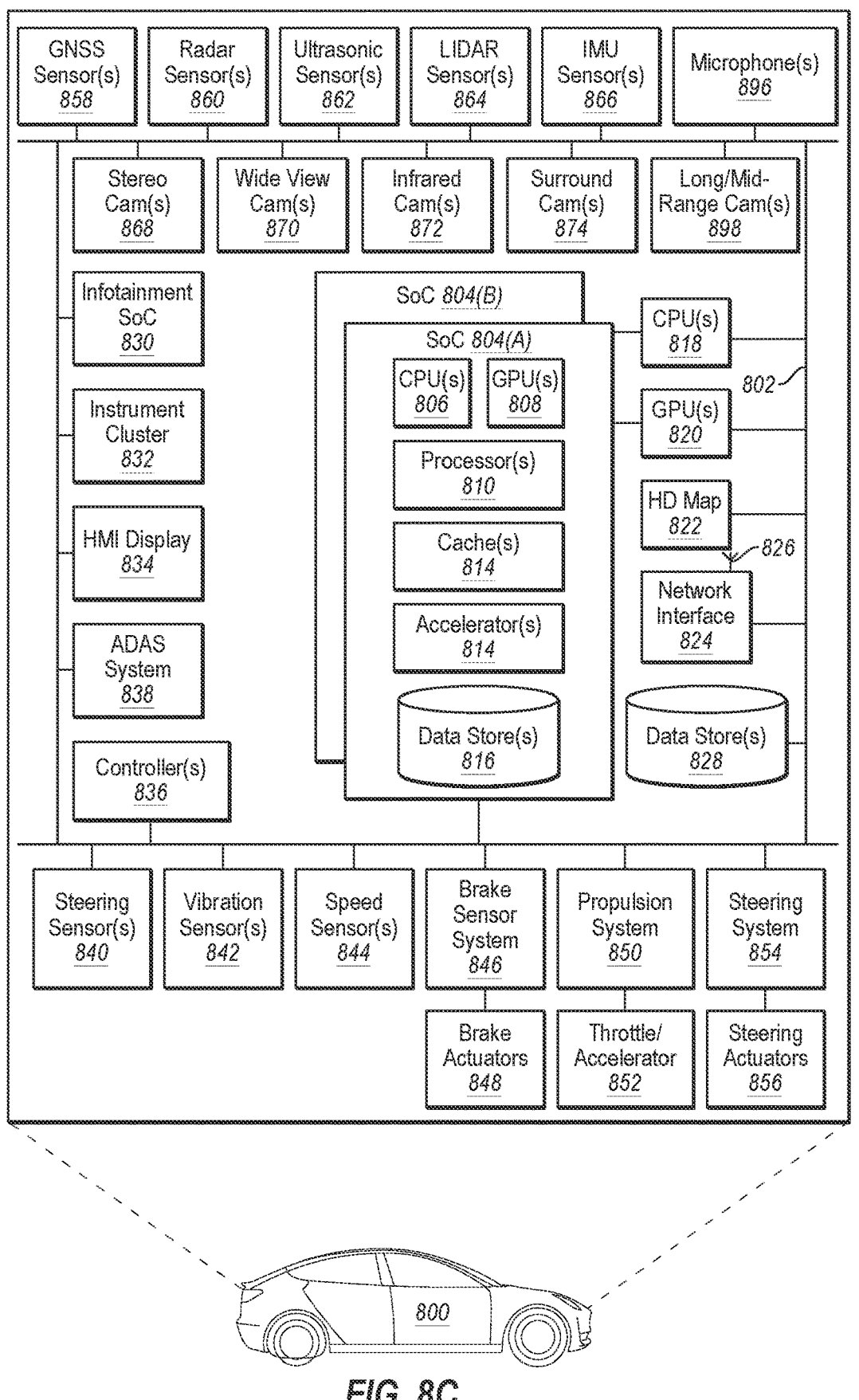
FIG. 8C is a block diagram of an example system architecture for the example autonomous vehicle of FIG. 8A, in accordance with some embodiments of the present disclosure.

FIG. 8C is a block diagram of an example system architecture for the example autonomous vehicle 800 of FIG. 8A, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Each of the components, features, and systems of the vehicle 800 in FIG. 8C is illustrated as being connected via bus 802. The bus 802 may include a Controller Area Network (CAN) data interface (alternatively referred to herein as a "CAN bus"). A CAN may be a network inside the vehicle 800 used to aid in control of various features and functionality of the vehicle 800, such as actuation of brakes, acceleration, braking, steering, windshield wipers, etc. A CAN bus may be configured to have dozens or even hundreds of nodes, each with its own unique identifier (e.g., a CAN ID). The CAN bus may be read to find steering wheel angle, ground speed, engine revolutions per minute (RPMs), button positions, and/or other vehicle status indicators. The CAN bus may be ASIL B compliant.

Although the bus 802 is described herein as being a CAN bus, this is not intended to be limiting. For example, in addition to, or alternatively from, the CAN bus, FlexRay and/or Ethernet may be used. Additionally, although a single line is used to represent the bus 802, this is not intended to be limiting. For example, there may be any number of busses 802, which may include one or more CAN busses, one or more FlexRay busses, one or more Ethernet busses, and/or one or more other types of busses using a different protocol. In some examples, two or more busses 802 may be used to perform different functions, and/or may be used for redundancy. For example, a first bus 802 may be used for collision avoidance functionality and a second bus 802 may be used for actuation control. In any example, each bus 802 may communicate with any of the components of the vehicle 800, and two or more busses 802 may communicate with the same components. In some examples, each SoC 804, each controller 836, and/or each computer within the vehicle may have access to the same input data (e.g., inputs from sensors of the vehicle 800), and may be connected to a common bus, such the CAN bus.

The vehicle 800 may include one or more controller(s) 836, such as those described herein with respect to FIG. 8A. The controller(s) 836 may be used for a variety of functions. The controller(s) 836 may be coupled to any of the various other components and systems of the vehicle 800 and may be used for control of the vehicle 800, artificial intelligence of the vehicle 800, infotainment for the vehicle 800, and/or the like.

The vehicle 800 may include a system(s) on a chip (SoC) 804. The SoC 804 may include CPU(s) 806, GPU(s) 808, processor(s) 810, cache(s) 812, accelerator(s) 814, data store(s) 816, and/or other components and features not illustrated. The SoC(s) 804 may be used to control the vehicle 800 in a variety of platforms and systems. For example, the SoC(s) 804 may be combined in a system (e.g., the system of the vehicle 800) with an HD map 822 which may obtain map refreshes and/or updates via a network interface 824 from one or more servers (e.g., server(s) 878 of FIG. 8D).

The CPU(s) 806 may include a CPU cluster or CPU complex (alternatively referred to herein as a "CCPLEX"). The CPU(s) 806 may include multiple cores and/or L2 caches. For example, in some embodiments, the CPU(s) 806 may include eight cores in a coherent multi-processor configuration. In some embodiments, the CPU(s) 806 may include four dual-core clusters where each cluster has a dedicated L2 cache (e.g., a 2 MB L2 cache). The CPU(s) 806 (e.g., the CCPLEX) may be configured to support simultaneous cluster operation enabling any combination of the clusters of the CPU(s) 806 to be active at any given time.

The CPU(s) 806 may implement power management capabilities that include one or more of the following features: individual hardware blocks may be clock-gated automatically when idle to save dynamic power; each core clock may be gated when the core is not actively executing instructions due to execution of WFI/WFE instructions; each core may be independently power-gated; each core cluster may be independently clock-gated when all cores are clock-gated or power-gated; and/or each core cluster may be independently power-gated when all cores are power-gated. The CPU(s) 806 may further implement an enhanced algorithm for managing power states, where allowed power states and expected wakeup times are specified, and the hardware/microcode determines the best power state to enter for the core, cluster, and CCPLEX. The processing cores may support simplified power state entry sequences in software with the work offloaded to microcode.

The GPU(s) 808 may include an integrated GPU (alternatively referred to herein as an "iGPU"). The GPU(s) 808 may be programmable and may be efficient for parallel workloads. The GPU(s) 808, in some examples, may use an enhanced tensor instruction set. The GPU(s) 808 may include one or more streaming microprocessors, where each streaming microprocessor may include an L1 cache (e.g., an L1 cache with at least 96 KB storage capacity), and two or more of the streaming microprocessors may share an L2 cache (e.g., an L2 cache with a 512 KB storage capacity). In some embodiments, the GPU(s) 808 may include at least eight streaming microprocessors. The GPU(s) 808 may use computer-based application programming interface(s) (API(s)). In addition, the GPU(s) 808 may use one or more parallel computing platforms and/or programming models (e.g., NVIDIA's CUDA).

The GPU(s) 808 may be power-optimized for best performance in automotive and embedded use cases. For example, the GPU(s) 808 may be fabricated on a Fin field-effect transistor (FinFET). However, this is not intended to be limiting, and the GPU(s) 808 may be fabricated using other semiconductor manufacturing processes. Each streaming microprocessor may incorporate a number of mixed-precision processing cores partitioned into multiple blocks. For example, and without limitation, 64 PF32 cores and 32 PF64 cores may be partitioned into four processing blocks. In such an example, each processing block may be allocated 16 FP32 cores, 8 FP64 cores, 16 INT32 cores, two mixed-precision NVIDIA TENSOR COREs for deep learning matrix arithmetic, an L0 instruction cache, a warp scheduler, a dispatch unit, and/or a 64 KB register file. In addition, the streaming microprocessors may include independent parallel integer and floating-point data paths to provide for efficient execution of workloads with a mix of computation and addressing calculations. The streaming microprocessors may include independent thread-scheduling capability to enable finer-grain synchronization and cooperation between parallel threads. The streaming microprocessors may include a combined L1 data cache and shared memory unit in order to improve performance while simplifying programming.

The GPU(s) 808 may include a high bandwidth memory (HBM) and/or a 16 GB HBM2 memory subsystem to provide, in some examples, about 900 GB/second peak memory bandwidth. In some examples, in addition to, or alternatively from, the HBM memory, a synchronous graphics random-access memory (SGRAM) may be used, such as a graphics double data rate type five synchronous random-access memory (GDDR5).

The GPU(s) 808 may include unified memory technology including access counters to allow for more accurate migration of memory pages to the processor that accesses them most frequently, thereby improving efficiency for memory ranges shared between processors. In some examples, address translation services (ATS) support may be used to allow the GPU(s) 808 to access the CPU(s) 806 page tables directly. In such examples, when the GPU(s) 808 memory management unit (MMU) experiences a miss, an address translation request may be transmitted to the CPU(s) 806. In response, the CPU(s) 806 may look in its page tables for the virtual-to-physical mapping for the address and transmits the translation back to the GPU(s) 808. As such, unified memory technology may allow a single unified virtual address space for memory of both the CPU(s) 806 and the GPU(s) 808, thereby simplifying the GPU(s) 808 programming and porting of applications to the GPU(s) 808.

In addition, the GPU(s) 808 may include an access counter that may keep track of the frequency of access of the GPU(s) 808 to memory of other processors. The access counter may help ensure that memory pages are moved to the physical memory of the processor that is accessing the pages most frequently.

The SoC(s) 804 may include any number of cache(s) 812, including those described herein. For example, the cache(s) 812 may include an L3 cache that is available to both the CPU(s) 806 and the GPU(s) 808 (e.g., that is connected to both the CPU(s) 806 and the GPU(s) 808). The cache(s) 812 may include a write-back cache that may keep track of states of lines, such as by using a cache coherence protocol (e.g., MEI, MESI, MSI, etc.). The L3 cache may include 4 MB or more, depending on the embodiment, although smaller cache sizes may be used.

The SoC(s) 804 may include an arithmetic logic unit(s) (ALU(s)) which may be leveraged in performing processing with respect to any of the variety of tasks or operations of the vehicle 800—such as processing DNNs. In addition, the SoC(s) 804 may include a floating point unit(s) (FPU(s))—or other math coprocessor or numeric coprocessor types—for performing mathematical operations within the system. For example, the SoC(s) 104 may include one or more FPUs integrated as execution units within a CPU(s) 806 and/or GPU(s) 808.

The SoC(s) 804 may include one or more accelerators 814 (e.g., hardware accelerators, software accelerators, or a combination thereof). For example, the SoC(s) 804 may include a hardware acceleration cluster that may include optimized hardware accelerators and/or large on-chip memory. The large on-chip memory (e.g., 4 MB of SRAM), may enable the hardware acceleration cluster to accelerate neural networks and other calculations. The hardware acceleration cluster may be used to complement the GPU(s) 808 and to off-load some of the tasks of the GPU(s) 808 (e.g., to free up more cycles of the GPU(s) 808 for performing other tasks). As an example, the accelerator(s) 814 may be used for targeted workloads (e.g., perception, convolutional neural networks (CNNs), etc.) that are stable enough to be amenable to acceleration. The term "CNN," as used herein, may include all types of CNNs, including region-based or regional convolutional neural networks (RCNNs) and Fast RCNNs (e.g., as used for object detection).

The accelerator(s) 814 (e.g., the hardware acceleration cluster) may include a deep learning accelerator(s) (DLA). The DLA(s) may include one or more Tensor processing units (TPUs) that may be configured to provide an additional ten trillion operations per second for deep learning applications and inferencing. The TPUs may be accelerators configured to, and optimized for, performing image processing functions (e.g., for CNNs, RCNNs, etc.). The DLA(s) may further be optimized for a specific set of neural network types and floating point operations, as well as inferencing. The design of the DLA(s) may provide more performance per millimeter than a general-purpose GPU, and vastly exceeds the performance of a CPU. The TPU(s) may perform several functions, including a single-instance convolution function, supporting, for example, INT8, INT16, and FP16 data types for both features and weights, as well as post-processor functions.

The DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

The DLA(s) may perform any function of the GPU(s) 808, and by using an inference accelerator, for example, a designer may target either the DLA(s) or the GPU(s) 808 for any function. For example, the designer may focus processing of CNNs and floating point operations on the DLA(s) and leave other functions to the GPU(s) 808 and/or other accelerator(s) 814.

The accelerator(s) 814 (e.g., the hardware acceleration cluster) may include a programmable vision accelerator(s) (PVA), which may alternatively be referred to herein as a computer vision accelerator. The PVA(s) may be designed and configured to accelerate computer vision algorithms for the advanced driver assistance systems (ADAS), autonomous driving, and/or augmented reality (AR) and/or virtual reality (VR) applications. The PVA(s) may provide a balance between performance and flexibility. For example, each PVA(s) may include, for example and without limitation, any number of reduced instruction set computer (RISC) cores, direct memory access (DMA), and/or any number of vector processors.

The RISC cores may interact with image sensors (e.g., the image sensors of any of the cameras described herein), image signal processor(s), and/or the like. Each of the RISC cores may include any amount of memory. The RISC cores may use any of a number of protocols, depending on the embodiment. In some examples, the RISC cores may execute a real-time operating system (RTOS). The RISC cores may be implemented using one or more integrated circuit devices, application specific integrated circuits (ASICs), and/or memory devices. For example, the RISC cores may include an instruction cache and/or a tightly coupled RAM.

The DMA may enable components of the PVA(s) to access the system memory independently of the CPU(s) 806. The DMA may support any number of features used to provide optimization to the PVA including, but not limited to, supporting multi-dimensional addressing and/or circular addressing. In some examples, the DMA may support up to six or more dimensions of addressing, which may include block width, block height, block depth, horizontal block stepping, vertical block stepping, and/or depth stepping.

The vector processors may be programmable processors that may be designed to efficiently and flexibly execute programming for computer vision algorithms and provide signal processing capabilities. In some examples, the PVA may include a PVA core and two vector processing subsystem partitions. The PVA core may include a processor subsystem, DMA engine(s) (e.g., two DMA engines), and/or other peripherals. The vector processing subsystem may operate as the primary processing engine of the PVA, and may include a vector processing unit (VPU), an instruction cache, and/or vector memory (e.g., VMEM). A VPU core may include a digital signal processor such as, for example, a single instruction, multiple data (SIMD), very long instruction word (VLIW) digital signal processor. The combination of the SIMD and VLIW may enhance throughput and speed.

Each of the vector processors may include an instruction cache and may be coupled to dedicated memory. As a result, in some examples, each of the vector processors may be configured to execute independently of the other vector processors. In other examples, the vector processors that are included in a particular PVA may be configured to employ data parallelism. For example, in some embodiments, the plurality of vector processors included in a single PVA may execute the same computer vision algorithm, but on different regions of an image. In other examples, the vector processors included in a particular PVA may simultaneously execute different computer vision algorithms, on the same image, or even execute different algorithms on sequential images or portions of an image. Among other things, any number of PVAs may be included in the hardware acceleration cluster and any number of vector processors may be included in each of the PVAs. In addition, the PVA(s) may include additional error correcting code (ECC) memory, to enhance overall system safety.

The accelerator(s) 814 (e.g., the hardware acceleration cluster) may include a computer vision network on-chip and SRAM, for providing a high-bandwidth, low latency SRAM for the accelerator(s) 814. In some examples, the on-chip memory may include at least 4 MB SRAM, consisting of, for example and without limitation, eight field-configurable memory blocks, that may be accessible by both the PVA and the DLA. Each pair of memory blocks may include an advanced peripheral bus (APB) interface, configuration circuitry, a controller, and a multiplexer. Any type of memory may be used. The PVA and DLA may access the memory via a backbone that provides the PVA and DLA with high-speed access to memory. The backbone may include a computer vision network on-chip that interconnects the PVA and the DLA to the memory (e.g., using the APB).

The computer vision network on-chip may include an interface that determines, before transmission of any control signal/address/data, that both the PVA and the DLA provide ready and valid signals. Such an interface may provide for separate phases and separate channels for transmitting control signals/addresses/data, as well as burst-type communications for continuous data transfer. This type of interface may comply with ISO 26262 or IEC 61508 standards, although other standards and protocols may be used.

In some examples, the SoC(s) 804 may include a real-time ray-tracing hardware accelerator, such as described in U.S. patent application Ser. No. 16/101,232, filed on Aug. 10, 2018. The real-time ray-tracing hardware accelerator may be used to quickly and efficiently determine the positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses. In some embodiments, one or more tree traversal units (TTUs) may be used for executing one or more ray-tracing related operations.

The accelerator(s) 814 (e.g., the hardware accelerator cluster) have a wide array of uses for autonomous driving. The PVA may be a programmable vision accelerator that may be used for key processing stages in ADAS and autonomous vehicles. The PVA's capabilities are a good match for algorithmic domains needing predictable processing, at low power and low latency. In other words, the PVA performs well on semi-dense or dense regular computation, even on small data sets, which need predictable run-times with low latency and low power. Thus, in the context of platforms for autonomous vehicles, the PVAs are designed to run classic computer vision algorithms, as they are efficient at object detection and operating on integer math.

For example, according to one embodiment of the technology, the PVA is used to perform computer stereo vision. A semi-global matching-based algorithm may be used in some examples, although this is not intended to be limiting. Many applications for Level 3-5 autonomous driving require motion estimation/stereo matching on-the-fly (e.g., structure from motion, pedestrian recognition, lane detection, etc.).

The PVA may perform computer stereo vision function on inputs from two monocular cameras.

In some examples, the PVA may be used to perform dense optical flow. For example, the PVA may be used to process raw RADAR data (e.g., using a 4D Fast Fourier Transform) to provide a processed RADAR signal before emitting the next RADAR pulse. In other examples, the PVA is used for time of flight depth processing, by processing raw time of flight data to provide processed time of flight data, for example.

The DLA may be used to run any type of network to enhance control and driving safety, including, for example, a neural network that outputs a measure of confidence for each object detection. Such a confidence value may be interpreted as a probability, or as providing a relative "weight" of each detection compared to other detections. This confidence value enables the system to make further decisions regarding which detections should be considered as true positive detections rather than false positive detections. For example, the system may set a threshold value for the confidence and consider only the detections exceeding the threshold value as true positive detections. In an automatic emergency braking (AEB) system, false positive detections would cause the vehicle to automatically perform emergency braking, which is obviously undesirable. Therefore, only the most confident detections should be considered as triggers for AEB. The DLA may run a neural network for regressing the confidence value. The neural network may take as its input at least some subset of parameters, such as bounding box dimensions, ground plane estimate obtained (e.g. from another subsystem), inertial measurement unit (IMU) sensor 866 output that correlates with the vehicle 800 orientation, distance, 3D location estimates of the object obtained from the neural network and/or other sensors (e.g., LIDAR sensor(s) 864 or RADAR sensor(s) 860), among others.

The SoC(s) 804 may include data store(s) 816 (e.g., memory). The data store(s) 816 may be on-chip memory of the SoC(s) 804, which may store neural networks to be executed on the GPU and/or the DLA. In some examples, the data store(s) 816 may be large enough in capacity to store multiple instances of neural networks for redundancy and safety. The data store(s) 816 may comprise L2 or L3 cache(s) 812. Reference to the data store(s) 816 may include reference to the memory associated with the PVA, DLA, and/or other accelerator(s) 814, as described herein.

The SoC(s) 804 may include one or more processor(s) 810 (e.g., embedded processors). The processor(s) 810 may include a boot and power management processor that may be a dedicated processor and subsystem to handle boot power and management functions and related security enforcement. The boot and power management processor may be a part of the SoC(s) 804 boot sequence and may provide runtime power management services. The boot power and management processor may provide clock and voltage programming, assistance in system low power state transitions, management of SoC(s) 804 thermals and temperature sensors, and/or management of the SoC(s) 804 power states. Each temperature sensor may be implemented as a ring-oscillator whose output frequency is proportional to temperature, and the SoC(s) 804 may use the ring-oscillators to detect temperatures of the CPU(s) 806, GPU(s) 808, and/or accelerator(s) 814. If temperatures are determined to exceed a threshold, the boot and power management processor may enter a temperature fault routine and put the SoC(s) 804 into a lower power state and/or put the vehicle 800 into a chauffeur to safe-stop mode (e.g., bring the vehicle 800 to a safe stop).

The processor(s) 810 may further include a set of embedded processors that may serve as an audio processing engine. The audio processing engine may be an audio subsystem that enables full hardware support for multi-channel audio over multiple interfaces, and a broad and flexible range of audio I/O interfaces. In some examples, the audio processing engine is a dedicated processor core with a digital signal processor with dedicated RAM.

The processor(s) 810 may further include an always-on processor engine that may provide necessary hardware features to support low power sensor management and wake use cases. The always-on processor engine may include a processor core, a tightly coupled RAM, supporting peripherals (e.g., timers and interrupt controllers), various I/O controller peripherals, and routing logic.

The processor(s) 810 may further include a safety cluster engine that includes a dedicated processor subsystem to handle safety management for automotive applications. The safety cluster engine may include two or more processor cores, a tightly coupled RAM, support peripherals (e.g., timers, an interrupt controller, etc.), and/or routing logic. In a safety mode, the two or more cores may operate in a lockstep mode and function as a single core with comparison logic to detect any differences between their operations.

The processor(s) 810 may further include a real-time camera engine that may include a dedicated processor subsystem for handling real-time camera management.

The processor(s) 810 may further include a high dynamic range signal processor that may include an image signal processor that is a hardware engine that is part of the camera processing pipeline.

The processor(s) 810 may include a video image compositor that may be a processing block (e.g., implemented on a microprocessor) that implements video post-processing functions needed by a video playback application to produce the final image for the player window. The video image compositor may perform lens distortion correction on wide-view camera(s) 870, surround camera(s) 874, and/or on in-cabin monitoring camera sensors. An in-cabin monitoring camera sensor is preferably monitored by a neural network running on another instance of the advanced SoC, configured to identify in-cabin events and respond accordingly. An in-cabin system may perform lip reading to activate cellular service and place a phone call, dictate emails, change the vehicle's destination, activate or change the vehicle's infotainment system and settings, or provide voice-activated web surfing. Certain functions are available to the driver only when the vehicle is operating in an autonomous mode, and are disabled otherwise.

The video image compositor may include enhanced temporal noise reduction for both spatial and temporal noise reduction. For example, where motion occurs in a video, the noise reduction weights spatial information appropriately, decreasing the weight of information provided by adjacent frames. Where an image or portion of an image does not include motion, the temporal noise reduction performed by the video image compositor may use information from the previous image to reduce noise in the current image.

The video image compositor may also be configured to perform stereo rectification on input stereo lens frames. The video image compositor may further be used for user interface composition when the operating system desktop is in use, and the GPU(s) 808 is not required to continuously render new surfaces. Even when the GPU(s) 808 is powered on and actively performing 3D rendering, the video image compositor may be used to offload the GPU(s) 808 to improve performance and responsiveness.

The SoC(s) 804 may further include a mobile industry processor interface (MIPI) camera serial interface for receiving video and input from cameras, a high-speed interface, and/or a video input block that may be used for camera and related pixel input functions. The SoC(s) 804 may further include an input/output controller(s) that may be controlled by software and may be used for receiving I/O signals that are uncommitted to a specific role.

The SoC(s) 804 may further include a broad range of peripheral interfaces to enable communication with peripherals, audio codecs, power management, and/or other devices. The SoC(s) 804 may be used to process data from cameras (e.g., connected over Gigabit Multimedia Serial Link and Ethernet), sensors (e.g., LIDAR sensor(s) 864, RADAR sensor(s) 860, etc. that may be connected over Ethernet), data from bus 802 (e.g., speed of vehicle 800, steering wheel position, etc.), data from GNSS sensor(s) 858 (e.g., connected over Ethernet or CAN bus). The SoC(s) 804 may further include dedicated high-performance mass storage controllers that may include their own DMA engines, and that may be used to free the CPU(s) 806 from routine data management tasks.

The SoC(s) 804 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. The SoC(s) 804 may be faster, more reliable, and even more energy-efficient and space-efficient than conventional systems. For example, the accelerator(s) 814, when combined with the CPU(s) 806, the GPU(s) 808, and the data store(s) 816, may provide for a fast, efficient platform for level 3-5 autonomous vehicles.

The technology thus provides capabilities and functionality that cannot be achieved by conventional systems. For example, computer vision algorithms may be executed on CPUs, which may be configured using high-level programming language, such as the C programming language, to execute a wide variety of processing algorithms across a wide variety of visual data. However, CPUs are oftentimes unable to meet the performance requirements of many computer vision applications, such as those related to execution time and power consumption, for example. In particular, many CPUs are unable to execute complex object detection algorithms in real-time, which is a requirement of in-vehicle ADAS applications, and a requirement for practical Level 3-5 autonomous vehicles.

In contrast to conventional systems, by providing a CPU complex, GPU complex, and a hardware acceleration cluster, the technology described herein allows for multiple neural networks to be performed simultaneously and/or sequentially, and for the results to be combined together to enable Level 3-5 autonomous driving functionality. For example, a CNN executing on the DLA or dGPU (e.g., the GPU(s) 820) may include a text and word recognition, allowing the supercomputer to read and understand traffic signs, including signs for which the neural network has not been specifically trained. The DLA may further include a neural network that is able to identify, interpret, and provide semantic understanding of the sign, and to pass that semantic understanding to the path-planning modules running on the CPU Complex.

As another example, multiple neural networks may be run simultaneously, as is required for Level 3, 4, or 5 driving.

For example, a warning sign consisting of "Caution: flashing lights indicate icy conditions," along with an electric light, may be independently or collectively interpreted by several neural networks. The sign itself may be identified as a traffic sign by a first deployed neural network (e.g., a neural network that has been trained), the text "Flashing lights indicate icy conditions" may be interpreted by a second deployed neural network, which informs the vehicle's path-planning software (preferably executing on the CPU Complex) that when flashing lights are detected, icy conditions exist. The flashing light may be identified by operating a third deployed neural network over multiple frames, informing the vehicle's path-planning software of the presence (or absence) of flashing lights. All three neural networks may run simultaneously, such as within the DLA and/or on the GPU(s) 808.

In some examples, a CNN for facial recognition and vehicle owner identification may use data from camera sensors to identify the presence of an authorized driver and/or owner of the vehicle 800. The always-on sensor processing engine may be used to unlock the vehicle when the owner approaches the driver door and turn on the lights, and, in security mode, to disable the vehicle when the owner leaves the vehicle. In this way, the SoC(s) 804 provide for security against theft and/or carjacking.

In another example, a CNN for emergency vehicle detection and identification may use data from microphones 896 to detect and identify emergency vehicle sirens. In contrast to conventional systems, which use general classifiers to detect sirens and manually extract features, the SoC(s) 804 use the CNN for classifying environmental and urban sounds, as well as classifying visual data. In a preferred embodiment, the CNN running on the DLA is trained to identify the relative closing speed of the emergency vehicle (e.g., by using the Doppler Effect). The CNN may also be trained to identify emergency vehicles specific to the local area in which the vehicle is operating, as identified by GNSS sensor(s) 858. Thus, for example, when operating in Europe the CNN will seek to detect European sirens, and when in the United States the CNN will seek to identify only North American sirens. Once an emergency vehicle is detected, a control program may be used to execute an emergency vehicle safety routine, slowing the vehicle, pulling over to the side of the road, parking the vehicle, and/or idling the vehicle, with the assistance of ultrasonic sensors 862, until the emergency vehicle(s) passes.

The vehicle may include a CPU(s) 818 (e.g., discrete CPU(s), or dCPU(s)), that may be coupled to the SoC(s) 804 via a high-speed interconnect (e.g., PCIe). The CPU(s) 818 may include an X86 processor, for example. The CPU(s) 818 may be used to perform any of a variety of functions, including arbitrating potentially inconsistent results between ADAS sensors and the SoC(s) 804, and/or monitoring the status and health of the controller(s) 836 and/or infotainment SoC 830, for example.

The vehicle 800 may include a GPU(s) 820 (e.g., discrete GPU(s), or dGPU(s)), that may be coupled to the SoC(s) 804 via a high-speed interconnect (e.g., NVIDIA's NVLINK). The GPU(s) 820 may provide additional artificial intelligence functionality, such as by executing redundant and/or different neural networks, and may be used to train and/or update neural networks based on input (e.g., sensor data) from sensors of the vehicle 800.

The vehicle 800 may further include the network interface 824 which may include one or more wireless antennas 826 (e.g., one or more wireless antennas for different communication protocols, such as a cellular antenna, a Bluetooth antenna, etc.). The network interface 824 may be used to enable wireless connectivity over the Internet with the cloud (e.g., with the server(s) 878 and/or other network devices), with other vehicles, and/or with computing devices (e.g., client devices of passengers). To communicate with other vehicles, a direct link may be established between the two vehicles and/or an indirect link may be established (e.g., across networks and over the Internet). Direct links may be provided using a vehicle-to-vehicle communication link. The vehicle-to-vehicle communication link may provide the vehicle 800 information about vehicles in proximity to the vehicle 800 (e.g., vehicles in front of, on the side of, and/or behind the vehicle 800). This functionality may be part of a cooperative adaptive cruise control functionality of the vehicle 800.

The network interface 824 may include an SoC that provides modulation and demodulation functionality and enables the controller(s) 836 to communicate over wireless networks. The network interface 824 may include a radio frequency front-end for up-conversion from baseband to radio frequency, and down conversion from radio frequency to baseband. The frequency conversions may be performed through well-known processes, and/or may be performed using super-heterodyne processes. In some examples, the radio frequency front end functionality may be provided by a separate chip. The network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

The vehicle 800 may further include data store(s) 828, which may include off-chip (e.g., off the SoC(s) 804) storage. The data store(s) 828 may include one or more storage elements including RAM, SRAM, DRAM, VRAM, Flash, hard disks, and/or other components and/or devices that may store at least one bit of data.

The vehicle 800 may further include GNSS sensor(s) 858 (e.g., GPS and/or assisted GPS sensors), to assist in mapping, perception, occupancy grid generation, and/or path planning functions. Any number of GNSS sensor(s) 858 may be used, including, for example and without limitation, a GPS using a USB connector with an Ethernet to serial (RS-232) bridge.

The vehicle 800 may further include RADAR sensor(s) 860. The RADAR sensor(s) 860 may be used by the vehicle 800 for long-range vehicle detection, even in darkness and/or severe weather conditions. RADAR functional safety levels may be ASIL B. The RADAR sensor(s) 860 may use the CAN and/or the bus 802 (e.g., to transmit data generated by the RADAR sensor(s) 860) for control and to access object tracking data, with access to Ethernet to access raw data, in some examples. A wide variety of RADAR sensor types may be used. For example, and without limitation, the RADAR sensor(s) 860 may be suitable for front, rear, and side RADAR use. In some example, Pulse Doppler RADAR sensor(s) are used.

The RADAR sensor(s) 860 may include different configurations, such as long-range with narrow field of view, short-range with wide field of view, short-range side coverage, etc. In some examples, long-range RADAR may be used for adaptive cruise control functionality. The long-range RADAR systems may provide a broad field of view realized by two or more independent scans, such as within a 250 m range. The RADAR sensor(s) 860 may help in distinguishing between static and moving objects, and may be used by ADAS systems for emergency brake assist and forward collision warning. Long-range RADAR sensors may include monostatic multimodal RADAR with multiple (e.g., six or more) fixed RADAR antennae and a high-speed CAN and FlexRay interface. In an example with six antennae, the central four antennae may create a focused beam pattern, designed to record the surrounding of the vehicle 800 at higher speeds with minimal interference from traffic in adjacent lanes. The other two antennae may expand the field of view, making it possible to quickly detect vehicles entering or leaving the vehicle's 800 lane.

Mid-range RADAR systems may include, as an example, a range of up to 860 m (front) or 80 m (rear), and a field of view of up to 42 degrees (front) or 850 degrees (rear). Short-range RADAR systems may include, without limitation, RADAR sensors designed to be installed at both ends of the rear bumper. When installed at both ends of the rear bumper, such a RADAR sensor system may create two beams that constantly monitor the blind spot in the rear and next to the vehicle.

Short-range RADAR systems may be used in an ADAS system for blind spot detection and/or lane change assist.

The vehicle 800 may further include ultrasonic sensor(s) 862. The ultrasonic sensor(s) 862, which may be positioned at the front, back, and/or the sides of the vehicle 800, may be used for park assist and/or to create and update an occupancy grid. A wide variety of ultrasonic sensor(s) 862 may be used, and different ultrasonic sensor(s) 862 may be used for different ranges of detection (e.g., 2.5 m, 4 m). The ultrasonic sensor(s) 862 may operate at functional safety levels of ASIL B.

The vehicle 800 may include LIDAR sensor(s) 864. The LIDAR sensor(s) 864 may be used for object and pedestrian detection, emergency braking, collision avoidance, and/or other functions. The LIDAR sensor(s) 864 may be functional safety level ASIL B. In some examples, the vehicle 800 may include multiple LIDAR sensors 864 (e.g., two, four, six, etc.) that may use Ethernet (e.g., to provide data to a Gigabit Ethernet switch).

In some examples, the LIDAR sensor(s) 864 may be capable of providing a list of objects and their distances for a 360-degree field of view. Commercially available LIDAR sensor(s) 864 may have an advertised range of approximately 100 m, with an accuracy of 2 cm-3 cm, and with support for a 100 Mbps Ethernet connection, for example. In some examples, one or more non-protruding LIDAR sensors 864 may be used. In such examples, the LIDAR sensor(s) 864 may be implemented as a small device that may be embedded into the front, rear, sides, and/or corners of the vehicle 800. The LIDAR sensor(s) 864, in such examples, may provide up to a 120-degree horizontal and 35-degree vertical field-of-view, with a 200 m range even for low-reflectivity objects. Front-mounted LIDAR sensor(s) 864 may be configured for a horizontal field of view between 45 degrees and 135 degrees.

In some examples, LIDAR technologies, such as 3D flash LIDAR, may also be used. 3D Flash LIDAR uses a flash of a laser as a transmission source, to illuminate vehicle surroundings up to approximately 200 m. A flash LIDAR unit includes a receptor, which records the laser pulse transit time and the reflected light on each pixel, which in turn corresponds to the range from the vehicle to the objects. Flash LIDAR may allow for highly accurate and distortion-free images of the surroundings to be generated with every laser flash. In some examples, four flash LIDAR sensors may be deployed, one at each side of the vehicle 800. Available 3D flash LIDAR systems include a solid-state 3D staring array LIDAR camera with no moving parts other than a fan (e.g., a non-scanning LIDAR device). The flash LIDAR device may use a five nanosecond class I (eye-safe) laser pulse per frame and may capture the reflected laser light in the form of 3D range point clouds and co-registered intensity data. By using flash LIDAR, and because flash LIDAR is a solid-state device with no moving parts, the LIDAR sensor(s) 864 may be less susceptible to motion blur, vibration, and/or shock.

The vehicle may further include IMU sensor(s) 866. The IMU sensor(s) 866 may be located at a center of the rear axle of the vehicle 800, in some examples. The IMU sensor(s) 866 may include, for example and without limitation, an accelerometer(s), a magnetometer(s), a gyroscope(s), a magnetic compass(es), and/or other sensor types. In some examples, such as in six-axis applications, the IMU sensor(s) 866 may include accelerometers and gyroscopes, while in nine-axis applications, the IMU sensor(s) 866 may include accelerometers, gyroscopes, and magnetometers.

In some embodiments, the IMU sensor(s) 866 may be implemented as a miniature, high-performance GPS-Aided Inertial Navigation System (GPS/INS) that combines micro-electro-mechanical systems (MEMS) inertial sensors, a high-sensitivity GPS receiver, and advanced Kalman filtering algorithms to provide estimates of position, velocity, and attitude. As such, in some examples, the IMU sensor(s) 866 may enable the vehicle 800 to estimate heading without requiring input from a magnetic sensor by directly observing and correlating the changes in velocity from GPS to the IMU sensor(s) 866. In some examples, the IMU sensor(s) 866 and the GNSS sensor(s) 858 may be combined in a single integrated unit.

The vehicle may include microphone(s) 896 placed in and/or around the vehicle 800. The microphone(s) 896 may be used for emergency vehicle detection and identification, among other things.

The vehicle may further include any number of camera types, including stereo camera(s) 868, wide-view camera(s) 870, infrared camera(s) 872, surround camera(s) 874, long-range and/or mid-range camera(s) 898, and/or other camera types. The cameras may be used to capture image data around an entire periphery of the vehicle 800. The types of cameras used depends on the embodiments and requirements for the vehicle 800, and any combination of camera types may be used to provide the necessary coverage around the vehicle 800. In addition, the number of cameras may differ depending on the embodiment. For example, the vehicle may include six cameras, seven cameras, ten cameras, twelve cameras, and/or another number of cameras. The cameras may support, as an example and without limitation, Gigabit Multimedia Serial Link (GMSL) and/or Gigabit Ethernet. Each of the camera(s) is described with more detail herein with respect to FIG. 8A and FIG. 8B.

The vehicle 800 may further include vibration sensor(s) 842. The vibration sensor(s) 842 may measure vibrations of components of the vehicle, such as the axle(s). For example, changes in vibrations may indicate a change in road surfaces. In another example, when two or more vibration sensors 842 are used, the differences between the vibrations may be used to determine friction or slippage of the road surface (e.g., when the difference in vibration is between a power-driven axle and a freely rotating axle).

The vehicle 800 may include an ADAS system 838. The ADAS system 838 may include an SoC, in some examples. The ADAS system 838 may include autonomous/adaptive/automatic cruise control (ACC), cooperative adaptive cruise control (CACC), forward crash warning (FCW), automatic emergency braking (AEB), lane departure warnings (LDW), lane keep assist (LKA), blind spot warning (BSW), rear cross-traffic warning (RCTW), collision warning systems (CWS), lane centering (LC), and/or other features and functionality.

The ACC systems may use RADAR sensor(s) 860, LIDAR sensor(s) 864, and/or a camera(s). The ACC systems may include longitudinal ACC and/or lateral ACC. Longitudinal ACC monitors and controls the distance to the vehicle immediately ahead of the vehicle 800 and automatically adjusts the vehicle speed to maintain a safe distance from vehicles ahead. Lateral ACC performs distance keeping, and advises the vehicle 800 to change lanes when necessary. Lateral ACC is related to other ADAS applications such as LC and CWS.

CACC uses information from other vehicles that may be received via the network interface 824 and/or the wireless antenna(s) 826 from other vehicles via a wireless link, or indirectly, over a network connection (e.g., over the Internet). Direct links may be provided by a vehicle-to-vehicle (V2V) communication link, while indirect links may be infrastructure-to-vehicle (I2V) communication links. In general, the V2V communication concept provides information about the immediately preceding vehicles (e.g., vehicles immediately ahead of and in the same lane as the vehicle 800), while the I2V communication concept provides information about traffic farther ahead. CACC systems may include either or both I2V and V2V information sources. Given the information of the vehicles ahead of the vehicle 800, CACC may be more reliable, and it has potential to improve traffic flow smoothness and reduce congestion on the road.

FCW systems are designed to alert the driver to a hazard, so that the driver may take corrective action. FCW systems use a front-facing camera and/or RADAR sensor(s) 860, coupled to a dedicated processor, DSP, FPGA, and/or ASIC, that is electrically coupled to driver feedback, such as a display, speaker, and/or vibrating component. FCW systems may provide a warning, such as in the form of a sound, visual warning, vibration and/or a quick brake pulse.

AEB systems detect an impending forward collision with another vehicle or other object, and may automatically apply the brakes if the driver does not take corrective action within a specified time or distance parameter. AEB systems may use front-facing camera(s) and/or RADAR sensor(s) 860, coupled to a dedicated processor, DSP, FPGA, and/or ASIC. When the AEB system detects a hazard, it typically first alerts the driver to take corrective action to avoid the collision and, if the driver does not take corrective action, the AEB system may automatically apply the brakes in an effort to prevent, or at least mitigate, the impact of the predicted collision. AEB systems, may include techniques such as dynamic brake support and/or crash imminent braking.

LDW systems provide visual, audible, and/or tactile warnings, such as steering wheel or seat vibrations, to alert the driver when the vehicle 800 crosses lane markings. An LDW system does not activate when the driver indicates an intentional lane departure, by activating a turn signal. LDW systems may use front-side facing cameras, coupled to a dedicated processor, DSP, FPGA, and/or ASIC, that is electrically coupled to driver feedback, such as a display, speaker, and/or vibrating component.

LKA systems are a variation of LDW systems. LKA systems provide steering input or braking to correct the vehicle 800 if the vehicle 800 starts to exit the lane.

BSW systems detect and warn the driver of vehicles in an automobile's blind spot. BSW systems may provide a visual, audible, and/or tactile alert to indicate that merging or changing lanes is unsafe. The system may provide an additional warning when the driver uses a turn signal. BSW systems may use rear-side facing camera(s) and/or RADAR sensor(s) 860, coupled to a dedicated processor, DSP, FPGA, and/or ASIC, that is electrically coupled to driver feedback, such as a display, speaker, and/or vibrating component.

RCTW systems may provide visual, audible, and/or tactile notification when an object is detected outside the rear-camera range when the vehicle 800 is backing up. Some RCTW systems include AEB to ensure that the vehicle brakes are applied to avoid a crash. RCTW systems may use one or more rear-facing RADAR sensor(s) 860, coupled to a dedicated processor, DSP, FPGA, and/or ASIC, that is electrically coupled to driver feedback, such as a display, speaker, and/or vibrating component.

Conventional ADAS systems may be prone to false positive results, which may be annoying and distracting to a driver, but typically are not catastrophic, because the ADAS systems alert the driver and allow the driver to decide whether a safety condition truly exists and act accordingly. However, in an autonomous vehicle 800, the vehicle 800 itself must, in the case of conflicting results, decide whether to heed the result from a primary computer or a secondary computer (e.g., a first controller 836 or a second controller 836). For example, in some embodiments, the ADAS system 838 may be a backup and/or secondary computer for providing perception information to a backup computer rationality module. The backup computer rationality monitor may run a redundant diverse software on hardware components to detect faults in perception and dynamic driving tasks. Outputs from the ADAS system 838 may be provided to a supervisory MCU. If outputs from the primary computer and the secondary computer conflict, the supervisory MCU must determine how to reconcile the conflict to ensure safe operation.

In some examples, the primary computer may be configured to provide the supervisory MCU with a confidence score, indicating the primary computer's confidence in the chosen result. If the confidence score exceeds a threshold, the supervisory MCU may follow the primary computer's direction, regardless of whether the secondary computer provides a conflicting or inconsistent result. Where the confidence score does not meet the threshold, and where the primary and secondary computer indicate different results (e.g., the conflict), the supervisory MCU may arbitrate between the computers to determine the appropriate outcome.

The supervisory MCU may be configured to run a neural network(s) that is trained and configured to determine, based on outputs from the primary computer and the secondary computer, conditions under which the secondary computer provides false alarms. Thus, the neural network(s) in the supervisory MCU may learn when the secondary computer's output can be trusted, and when it cannot. For example, when the secondary computer is a RADAR-based FCW system, a neural network(s) in the supervisory MCU may learn when the FCW system is identifying metallic objects that are not, in fact, hazards, such as a drainage grate or manhole cover that triggers an alarm. Similarly, when the secondary computer is a camera-based LDW system, a neural network in the supervisory MCU may learn to override the LDW when bicyclists or pedestrians are present and a lane departure is, in fact, the safest maneuver. In embodiments that include a neural network(s) running on the supervisory MCU, the supervisory MCU may include at least one of a DLA or GPU suitable for running the neural network(s) with associated memory. In preferred embodiments, the supervisory MCU may comprise and/or be included as a component of the SoC(s) 804.

In other examples, ADAS system 838 may include a secondary computer that performs ADAS functionality using traditional rules of computer vision. As such, the secondary computer may use classic computer vision rules (if-then), and the presence of a neural network(s) in the supervisory MCU may improve reliability, safety and performance. For example, the diverse implementation and intentional non-identity make the overall system more fault-tolerant, especially to faults caused by software (or software-hardware interface) functionality. For example, if there is a software bug or error in the software running on the primary computer, and the non-identical software code running on the secondary computer provides the same overall result, the supervisory MCU may have greater confidence that the overall result is correct, and the bug in software or hardware used by the primary computer is not causing material error.

In some examples, the output of the ADAS system 838 may be fed into the primary computer's perception block and/or the primary computer's dynamic driving task block. For example, if the ADAS system 838 indicates a forward crash warning due to an object immediately ahead, the perception block may use this information when identifying objects. In other examples, the secondary computer may have its own neural network that is trained and thus reduces the risk of false positives, as described herein.

The vehicle 800 may further include the infotainment SoC 830 (e.g., an in-vehicle infotainment system (IVI)). Although illustrated and described as an SoC, the infotainment system may not be a SoC, and may include two or more discrete components. The infotainment SoC 830 may include a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, Wi-Fi, etc.), and/or information services (e.g., navigation systems, rear-parking assistance, a radio data system, vehicle-related information such as fuel level, total distance covered, brake fuel level, oil level, door open/close, air filter information, etc.) to the vehicle 800. For example, the infotainment SoC 830 may include radios, disk players, navigation systems, video players, USB and Bluetooth connectivity, carputers, in-car entertainment, Wi-Fi, steering wheel audio controls, hands-free voice control, a heads-up display (HUD), an HMI display 834, a telematics device, a control panel (e.g., for controlling and/or interacting with various components, features, and/or systems), and/or other components. The infotainment SoC 830 may further be used to provide information (e.g., visual and/or audible) to a user(s) of the vehicle, such as information from the ADAS system 838, autonomous driving information such as planned vehicle maneuvers, trajectories, surrounding environment information (e.g., intersection information, vehicle information, road information, etc.), and/or other information.

The infotainment SoC 830 may include GPU functionality. The infotainment SoC 830 may communicate over the bus 802 (e.g., CAN bus, Ethernet, etc.) with other devices, systems, and/or components of the vehicle 800. In some examples, the infotainment SoC 830 may be coupled to a supervisory MCU such that the GPU of the infotainment system may perform some self-driving functions in the event that the primary controller(s) 836 (e.g., the primary and/or backup computers of the vehicle 800) fail. In such an example, the infotainment SoC 830 may put the vehicle 800 into a chauffeur to safe-stop mode, as described herein.

The vehicle 800 may further include an instrument cluster 832 (e.g., a digital dash, an electronic instrument cluster, a digital instrument panel, etc.). The instrument cluster 832 may include a controller and/or supercomputer (e.g., a discrete controller or supercomputer). The instrument cluster 832 may include a set of instrumentation such as a speedometer, fuel level, oil pressure, tachometer, odometer, turn indicators, gearshift position indicator, seat belt warning light(s), parking-brake warning light(s), engine-malfunction light(s), airbag (SRS) system information, lighting controls, safety system controls, navigation information, etc. In some examples, information may be displayed and/or shared among the infotainment SoC 830 and the instrument cluster 832. In other words, the instrument cluster 832 may be included as part of the infotainment SoC 830, or vice versa.

Figure 8D:
FIG. 8D is a system diagram for communication between cloud-based server(s) and the example autonomous vehicle of FIG. 8A, in accordance with some embodiments of the present disclosure.

FIG. 8D is a system diagram for communication between cloud-based server(s) and the example autonomous vehicle 800 of FIG. 8A, in accordance with some embodiments of the present disclosure. The system 876 may include server(s) 878, network(s) 890, and vehicles, including the vehicle 800. The server(s) 878 may include a plurality of GPUs 884(A)-884(H) (collectively referred to herein as GPUs 884), PCIe switches 882(A)-882(H) (collectively referred to herein as PCIe switches 882), and/or CPUs 880(A)-880(B) (collectively referred to herein as CPUs 880). The GPUs 884, the CPUs 880, and the PCIe switches may be interconnected with high-speed interconnects such as, for example and without limitation, NVLink interfaces 888 developed by NVIDIA and/or PCIe connections 886. In some examples, the GPUs 884 are connected via NVLink and/or NVSwitch SoC and the GPUs 884 and the PCIe switches 882 are connected via PCIe interconnects. Although eight GPUs 884, two CPUs 880, and two PCIe switches are illustrated, this is not intended to be limiting. Depending on the embodiment, each of the server(s) 878 may include any number of GPUs 884, CPUs 880, and/or PCIe switches. For example, the server(s) 878 may each include eight, sixteen, thirty-two, and/or more GPUs 884.

The server(s) 878 may receive, over the network(s) 890 and from the vehicles, image data representative of images showing unexpected or changed road conditions, such as recently commenced roadwork. The server(s) 878 may transmit, over the network(s) 890 and to the vehicles, neural networks 892, updated neural networks 892, and/or map information 894, including information regarding traffic and road conditions. The updates to the map information 894 may include updates for the HD map 822, such as information regarding construction sites, potholes, detours, flooding, and/or other obstructions. In some examples, the neural networks 892, the updated neural networks 892, and/or the map information 894 may have resulted from new training and/or experiences represented in data received from any number of vehicles in the environment, and/or based on training performed at a datacenter (e.g., using the server(s) 878 and/or other servers).

The server(s) 878 may be used to train machine learning models (e.g., neural networks) based on training data. The training data may be generated by the vehicles, and/or may be generated in a simulation (e.g., using a game engine). In some examples, the training data is tagged (e.g., where the neural network benefits from supervised learning) and/or undergoes other pre-processing, while in other examples the training data is not tagged and/or pre-processed (e.g., where the neural network does not require supervised learning). Training may be executed according to any one or more classes of machine learning techniques, including, without limitation, classes such as: supervised training, semi-supervised training, unsupervised training, self learning, reinforcement learning, federated learning, transfer learning, feature learning (including principal component and cluster analyses), multi-linear subspace learning, manifold learning, representation learning (including spare dictionary learning), rule-based machine learning, anomaly detection, and any variants or combinations therefor. Once the machine learning models are trained, the machine learning models may be used by the vehicles (e.g., transmitted to the vehicles over the network(s) 890, and/or the machine learning models may be used by the server(s) 878 to remotely monitor the vehicles.

In some examples, the server(s) 878 may receive data from the vehicles and apply the data to up-to-date real-time neural networks for real-time intelligent inferencing. The server(s) 878 may include deep-learning supercomputers and/or dedicated AI computers powered by GPU(s) 884, such as a DGX and DGX Station machines developed by NVIDIA. However, in some examples, the server(s) 878 may include deep learning infrastructure that use only CPU-powered datacenters.

The deep-learning infrastructure of the server(s) 878 may be capable of fast, real-time inferencing, and may use that capability to evaluate and verify the health of the processors, software, and/or associated hardware in the vehicle 800. For example, the deep-learning infrastructure may receive periodic updates from the vehicle 800, such as a sequence of images and/or objects that the vehicle 800 has located in that sequence of images (e.g., via computer vision and/or other machine learning object classification techniques). The deep-learning infrastructure may run its own neural network to identify the objects and compare them with the objects identified by the vehicle 800 and, if the results do not match and the infrastructure concludes that the AI in the vehicle 800 is malfunctioning, the server(s) 878 may transmit a signal to the vehicle 800 instructing a fail-safe computer of the vehicle 800 to assume control, notify the passengers, and complete a safe parking maneuver.

For inferencing, the server(s) 878 may include the GPU(s) 884 and one or more programmable inference accelerators (e.g., NVIDIA's TensorRT). The combination of GPU-powered servers and inference acceleration may make real-time responsiveness possible. In other examples, such as where performance is less critical, servers powered by CPUs, FPGAs, and other processors may be used for inferencing.

Example Computing Device

Figure 9:
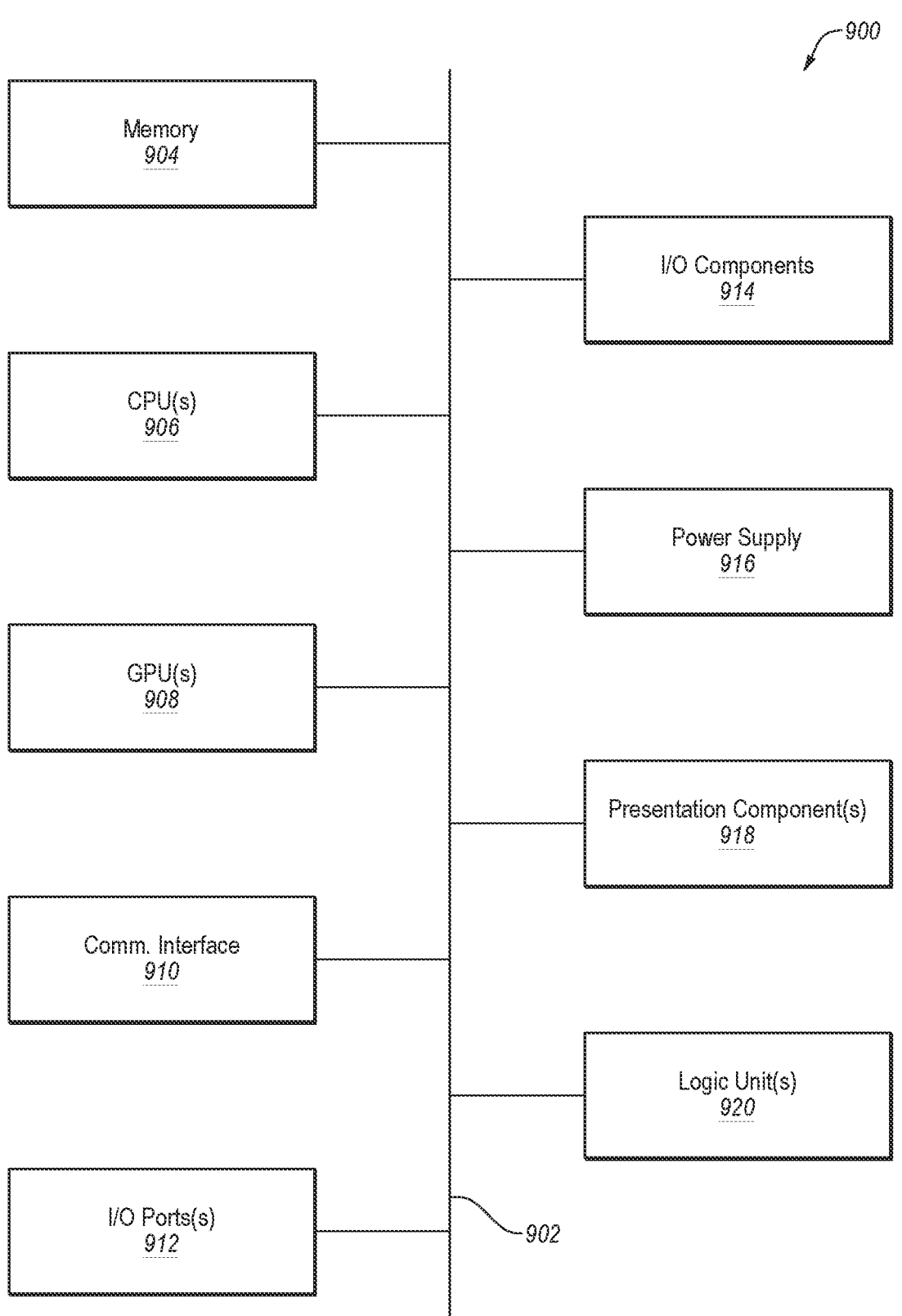
FIG. 9 is a block diagram of an example computing device suitable for use in implementing some embodiments of the present disclosure.

FIG. 9 is a block diagram of an example computing device(s) 900 suitable for use in implementing some embodiments of the present disclosure. Computing device 900 may include an interconnect system 902 that directly or indirectly couples the following devices: memory 904, one or more central processing units (CPUs) 906, one or more graphics processing units (GPUs) 908, a communication interface 910, I/O ports 912, input/output components 914, a power supply 916, one or more presentation components 918 (e.g., display(s)), and one or more logic units 920.

Although the various blocks of FIG. 9 are shown as connected via the interconnect system 902 with lines, this is not intended to be limiting and is for clarity only. For example, in some embodiments, a presentation component 918, such as a display device, may be considered an I/O component 914 (e.g., if the display is a touch screen). As another example, the CPUs 906 and/or GPUs 908 may include memory (e.g., the memory 904 may be representative of a storage device in addition to the memory of the GPUs 908, the CPUs 906, and/or other components). In other words, the computing device of FIG. 9 is merely illustrative. Distinction is not made between such categories as "workstation," "server," "laptop," "desktop," "tablet," "client device," "mobile device," "hand-held device," "game console," "electronic control unit (ECU)," "virtual reality system," "augmented reality system," and/or other device or system types, as all are contemplated within the scope of the computing device of FIG. 9.

The interconnect system 902 may represent one or more links or busses, such as an address bus, a data bus, a control bus, or a combination thereof. The interconnect system 902 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 906 may be directly connected to the memory 904. Further, the CPU 906 may be directly connected to the GPU 908. Where there is direct, or point-to-point, connection between components, the interconnect system 902 may include a PCIe link to carry out the connection. In these examples, a PCI bus need not be included in the computing device 900.

The memory 904 may include any of a variety of computer-readable media. The computer-readable media may be any available media that may be accessed by the computing device 900. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 904 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information and that may be accessed by computing device 900. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 906 may be configured to execute at least some of the computer-readable instructions to control one or more components of the computing device 900 to perform one or more of the methods and/or processes described herein. The CPU(s) 906 may each include one or more cores (e.g., one, two, four, eight, twenty-eight, seventy-two, etc.) that are capable of handling a multitude of software threads simultaneously. The CPU(s) 906 may include any type of processor, and may include different types of processors depending on the type of computing device 900 implemented (e.g., processors with fewer cores for mobile devices and processors with more cores for servers). For example, depending on the type of computing device 900, the processor may be an Advanced RISC Machines (ARM) processor implemented using Reduced Instruction Set Computing (RISC) or an x86 processor implemented using Complex Instruction Set Computing (CISC). The computing device 900 may include one or more CPUs 906 in addition to one or more microprocessors or supplementary co-processors, such as math co-processors.

In addition to or alternatively from the CPU(s) 906, the GPU(s) 908 may be configured to execute at least some of the computer-readable instructions to control one or more components of the computing device 900 to perform one or more of the methods and/or processes described herein. One or more of the GPU(s) 908 may be an integrated GPU (e.g., with one or more of the CPU(s) 906 and/or one or more of the GPU(s) 908 may be a discrete GPU. In embodiments, one or more of the GPU(s) 908 may be a coprocessor of one or more of the CPU(s) 906. The GPU(s) 908 may be used by the computing device 900 to render graphics (e.g., 3D graphics) or perform general purpose computations. For example, the GPU(s) 908 may be used for General-Purpose computing on GPUs (GPGPU). The GPU(s) 908 may include hundreds or thousands of cores that are capable of handling hundreds or thousands of software threads simultaneously. The GPU(s) 908 may generate pixel data for output images in response to rendering commands (e.g., rendering commands from the CPU(s) 906 received via a host interface). The GPU(s) 908 may include graphics memory, such as display memory, for storing pixel data or any other suitable data, such as GPGPU data. The display memory may be included as part of the memory 904. The GPU(s) 908 may include two or more GPUs operating in parallel (e.g., via a link). The link may directly connect the GPUs (e.g., using NVLINK) or may connect the GPUs through a switch (e.g., using NVSwitch). When combined together, each GPU 908 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 906 and/or the GPU(s) 908, the logic unit(s) 920 may be configured to execute at least some of the computer-readable instructions to control one or more components of the computing device 900 to perform one or more of the methods and/or processes described herein. In embodiments, the CPU(s) 906, the GPU(s) 908, and/or the logic unit(s) 920 may discretely or jointly perform any combination of the methods, processes and/or portions thereof. One or more of the logic units 920 may be part of and/or integrated in one or more of the CPU(s) 906 and/or the GPU(s) 908 and/or one or more of the logic units 920 may be discrete components or otherwise external to the CPU(s) 906 and/or the GPU(s) 908. In embodiments, one or more of the logic units 920 may be a coprocessor of one or more of the CPU(s) 906 and/or one or more of the GPU(s) 908.

Examples of the logic unit(s) 920 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), I/O elements, peripheral component interconnect (PCI) or peripheral component interconnect express (PCIe) elements, and/or the like.

The communication interface 910 may include one or more receivers, transmitters, and/or transceivers that enable the computing device 900 to communicate with other computing devices via an electronic communication network, including wired and/or wireless communications. The communication interface 910 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 912 may enable the computing device 900 to be logically coupled to other devices including the I/O components 914, the presentation component(s) 918, and/or other components, some of which may be built into (e.g., integrated in) the computing device 900. Illustrative I/O components 914 include a microphone, mouse, keyboard, joystick, game pad, game controller, satellite dish, scanner, printer, wireless device, etc. The I/O components 914 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 900. The computing device 900 may include depth cameras, such as stereoscopic camera systems, infrared camera systems, RGB camera systems, touchscreen technology, and combinations of these, for gesture detection and recognition. Additionally, the computing device 900 may include accelerometers or gyroscopes (e.g., as part of an inertia measurement unit (IMU)) that enable detection of motion. In some examples, the output of the accelerometers or gyroscopes may be used by the computing device 900 to render immersive augmented reality or virtual reality.

The power supply 916 may include a hard-wired power supply, a battery power supply, or a combination thereof. The power supply 916 may provide power to the computing device 900 to enable the components of the computing device 900 to operate.

The presentation component(s) 918 may include a display (e.g., a monitor, a touch screen, a television screen, a heads-up-display (HUD), other display types, or a combination thereof), speakers, and/or other presentation components. The presentation component(s) 918 may receive data from other components (e.g., the GPU(s) 908, the CPU(s) 906, etc.), and output the data (e.g., as an image, video, sound, etc.).

Example Data Center

Figure 10:
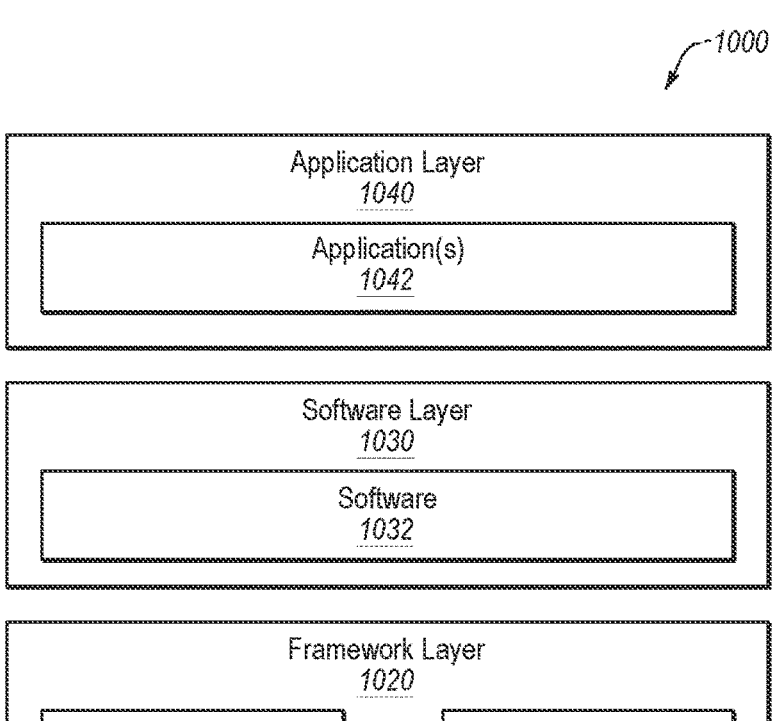
FIG. 10 is a block diagram of an example data center suitable for use in implementing some embodiments of the present disclosure.
Figure 10:
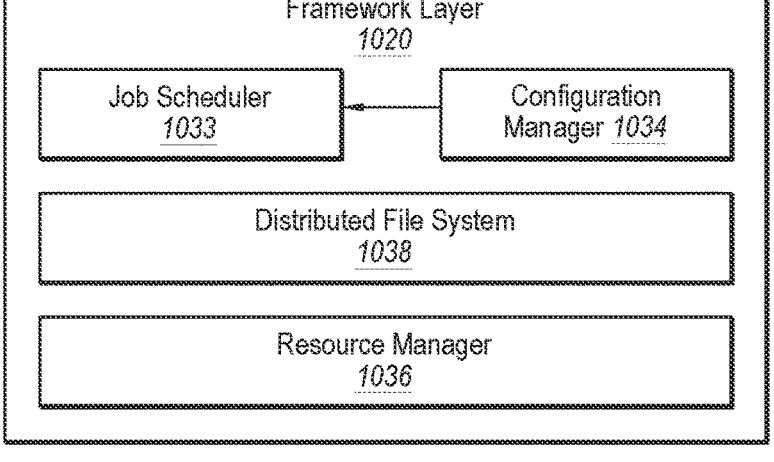
Figure 10:
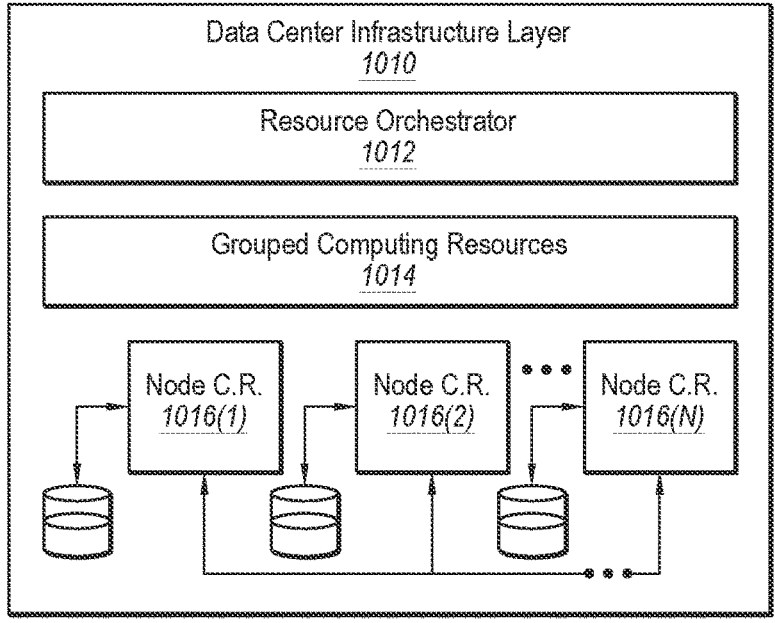

FIG. 10 illustrates an example data center 1000 that may be used in at least one embodiments of the present disclosure. The data center 1000 may include a data center infrastructure layer 1010, a framework layer 1020, a software layer 1030, and/or an application layer 1040.

As shown in FIG. 10, the data center infrastructure layer 1010 may include a resource orchestrator 1012, grouped computing resources 1014, and node computing resources ("node C.R.s") 1016(1) 1016(N), where "N" represents any whole, positive integer. In at least one embodiment, node C.R.s 1016(1) 1016(N) may include, but are not limited to, any number of central processing units (CPUs) or other processors (including DPUs, accelerators, field programmable gate arrays (FPGAs), graphics processors or graphics processing units (GPUs), etc.), memory devices (e.g., dynamic read-only memory), storage devices (e.g., solid state or disk drives), network input/output (NW I/O) devices, network switches, virtual machines (VMs), power modules, and/or cooling modules, etc. In some embodiments, one or more node C.R.s from among node C.R.s 1016(1) 1016(N) may correspond to a server having one or more of the above-mentioned computing resources. In addition, in some embodiments, the node C.R.s 1016(1) 1016(N) may include one or more virtual components, such as vGPUs, vCPUs, and/or the like, and/or one or more of the node C.R.s 1016(1) 1016(N) may correspond to a virtual machine (VM).

In at least one embodiment, grouped computing resources 1014 may include separate groupings of node C.R.s 1016 housed within one or more racks (not shown), or many racks housed in data centers at various geographical locations (also not shown). Separate groupings of node C.R.s 1016 within grouped computing resources 1014 may include grouped compute, network, memory or storage resources that may be configured or allocated to support one or more workloads. In at least one embodiment, several node C.R.s 1016 including CPUs, GPUs, DPUs, and/or other processors may be grouped within one or more racks to provide compute resources to support one or more workloads. The one or more racks may also include any number of power modules, cooling modules, and/or network switches, in any combination.

The resource orchestrator 1012 may configure or otherwise control one or more node C.R.s 1016(1) 1016(N) and/or grouped computing resources 1014. In at least one embodiment, resource orchestrator 1012 may include a software design infrastructure (SDI) management entity for the data center 1000. The resource orchestrator 1012 may include hardware, software, or some combination thereof.

In at least one embodiment, as shown in FIG. 10, framework layer 1020 may include a job scheduler 1033, a configuration manager 1034, a resource manager 1036, and/or a distributed file system 1038. The framework layer 1020 may include a framework to support software 1032 of software layer 1030 and/or one or more application(s) 1042 of application layer 1040. The software 1032 or application(s) 1042 may respectively include web-based service software or applications, such as those provided by Amazon Web Services, Google Cloud and Microsoft Azure. The framework layer 1020 may be, but is not limited to, a type of free and open-source software web application framework such as Apache Spark™ (hereinafter "Spark") that may utilize distributed file system 1038 for large-scale data processing (e.g., "big data"). In at least one embodiment, job scheduler 1033 may include a Spark driver to facilitate scheduling of workloads supported by various layers of data center 1000. The configuration manager 1034 may be capable of configuring different layers such as software layer 1030 and framework layer 1020 including Spark and distributed file system 1038 for supporting large-scale data processing. The resource manager 1036 may be capable of managing clustered or grouped computing resources mapped to or allocated for support of distributed file system 1038 and job scheduler 1033. In at least one embodiment, clustered or grouped computing resources may include grouped computing resource 1014 at data center infrastructure layer 1010. The resource manager 1036 may coordinate with resource orchestrator 1012 to manage these mapped or allocated computing resources.

In at least one embodiment, software 1032 included in software layer 1030 may include software used by at least portions of node C.R.s 1016(1) 1016(N), grouped computing resources 1014, and/or distributed file system 1038 of framework layer 1020. One or more types of software may include, but are not limited to, Internet web page search software, e-mail virus scan software, database software, and streaming video content software.

In at least one embodiment, application(s) 1042 included in application layer 1040 may include one or more types of applications used by at least portions of node C.R.s 1016(1) 1016(N), grouped computing resources 1014, and/or distributed file system 1038 of framework layer 1020. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more embodiments.

In at least one embodiment, any of configuration manager 1034, resource manager 1036, and resource orchestrator 1012 may implement any number and type of self-modifying actions based on any amount and type of data acquired in any technically feasible fashion. Self-modifying actions may relieve a data center operator of data center 1000 from making possibly bad configuration decisions and possibly avoiding underutilized and/or poor performing portions of a data center.

The data center 1000 may include tools, services, software or other resources to train one or more machine learning models or predict or infer information using one or more machine learning models according to one or more embodiments described herein. For example, a machine learning model(s) may be trained by calculating weight parameters according to a neural network architecture using software and/or computing resources described above with respect to the data center 1000. In at least one embodiment, trained or deployed machine learning models corresponding to one or more neural networks may be used to infer or predict information using resources described above with respect to the data center 1000 by using weight parameters calculated through one or more training techniques, such as but not limited to those described herein.

In at least one embodiment, the data center 1000 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing device(s) 900 of FIG. 9—e.g., each device may include similar components, features, and/or functionality of the computing device(s) 900. In addition, where backend devices (e.g., servers, NAS, etc.) are implemented, the backend devices may be included as part of a data center 1000, an example of which is described in more detail herein with respect to FIG. 10.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 900 described herein with respect to FIG. 9. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to codes that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

Further, use of the term "based at least on" in the present disclosure or claims does not mean that omission of "at least" in other places term means "only". For example, use of the term "based on X" in the present disclosure or claims may also mean "based at least on X" even though the term "at least" is not used in the particular instance but is used elsewhere.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:

performing a first test with respect to a computing system, the first test being performed while a first chiplet of the computing system is enabled and while a second chiplet of the computing system is disabled, the first chiplet including a first subset of one or more first system elements of the computing system and the second chiplet including a second subset of one or more second system elements of the computing system; and performing a second test with respect to the computing system, the second test being performed while the second chiplet is enabled and while the first chiplet is disabled, the first test and the second test using a same test image, the test image including one or more of:

stimuli for providing to the computing system to test behavior of the computing system in response to receiving the stimuli, the stimuli including one or more first-chiplet stimuli designated for the first chiplet but not designated for the second chiplet; or one or more expected behaviors of the computing system in response to receiving the one or more stimuli.

2. The method of claim 1, wherein the first chiplet is enabled and the second chiplet is disabled during the first test based at least on a power budget constraint associated with the computing system.

3. The method of claim 1, further comprising:

generating, for the second test, a first automatic response associated with the first chiplet in place of first expected behavior from the first chiplet; and generating, for the first test, a second automatic response associated with the second chiplet in place of second expected behavior from the second chiplet.

4. The method of claim 1, wherein the first chiplet is disabled using power gating.

5. The method of claim 4, wherein the power gating includes adjusting current delivered to the first chiplet.

6. The method of claim 1, wherein one or more of the first test or the second test includes one or more of a logic test or a memory test.

7. The method of claim 1, wherein the test image corresponds to the computing system as a whole.

8. A computing system comprising:

a first chiplet including a first subset of system elements;

a second chiplet including a second subset of system elements; and a central controller to cause a first test and a second test to be performed with respect to the computing system, the first test being performed while the first chiplet is enabled and the second chiplet is disabled, and the second test being performed while the first chiplet is disabled and the second chiplet is enabled, the first test and the second test using a same test image that includes one or more first expected behaviors corresponding directly to the first chiplet but not the second chiplet and one or more second expected behaviors corresponding directly to the second chiplet but not the first chiplet.

9. The computing system of claim 8, further comprising:

a first local controller associated with the first chiplet and communicatively coupled to the central controller, the first local controller to obtain the test image from the central controller and to provide the test image to the first chiplet as part of performance of the first test; and a second local controller associated with the second chiplet and communicatively coupled to the central controller, the second local controller to obtain the test image from the central controller and to provide the test image to the second chiplet as part of performance of the second test.

10. The computing system of claim 8, wherein the first chiplet is enabled and the second chiplet is disabled during the first test based at least on a power budget constraint associated with the computing system.

11. The computing system of claim 8, wherein:

the central controller generates an automatic response associated with the first chiplet to emulate a response from the first chiplet during the second test.

12. The computing system of claim 8, wherein the first chiplet is disabled using power gating.

13. The computing system of claim 8, wherein one or more of the first test or the second test includes one or more of a logic test or a memory test.

14. The computing system of claim 8, wherein the test image corresponds to the computing system as a whole.

15. The computing system of claim 8, wherein the computing system comprises one or more of:

a control system for an autonomous or semi-autonomous machine;

a perception system for an autonomous or semi-autonomous machine;

a system for performing simulation operations;

a system for performing digital twin operations;

a system for performing light transport simulation;

a system for performing collaborative content creation for 3D assets;

a system for performing deep learning operations;

a system implemented using an edge device;

a system for generating or presenting at least one virtual reality content, augmented reality content, or mixed reality content;

a system implemented using a robot;

a system for performing conversational AI operations;

a system for generating synthetic data;

a system incorporating one or more virtual machines (VMs);

a system implemented at least partially in a data center; or a system implemented at least partially using cloud computing resources.

16. A processor comprising:

one or more processing units to perform a system test, at least, by:

sending a test image to a first chiplet to generate first test results corresponding to a first test associated with the first chiplet, the first chiplet including a first subset of one or more system elements of a computing system; and generating an automatic response associated with a second chiplet that is disabled during the first test to emulate a response from the second chiplet during the first test, the second chiplet including a second subset of one or more system elements of the computing system.

17. The processor of claim 16, wherein the first chiplet is powered off during an initiation of the system test, powered on during a portion of the system test, and powered off after generating the first test results.

18. The processor of claim 16, further comprising providing the test image to a third chiplet to generate third test results during the system test, the third chiplet including a third subset of one or more system elements of the computing system, and wherein the first test results and the third test results are generated in non-overlapping time frames.

19. The processor of claim 18, wherein the first subset of one or more system elements differs from the third subset of one or more system elements and the test image provided to the first chiplet is also provided to the third chiplet.

20. The processor of claim 16, wherein the processor is comprised in one or more of:
- a control system for an autonomous or semi-autonomous machine;
- a perception system for an autonomous or semi-autonomous machine;
- a system for performing simulation operations;
- a system for performing digital twin operations;
- a system for performing light transport simulation;
- a system for performing collaborative content creation for 3D assets;
- a system for performing deep learning operations;
- a system implemented using an edge device;
- a system for generating or presenting at least one virtual reality content, augmented reality content, or mixed reality content;
- a system implemented using a robot;
- a system for performing conversational AI operations;
- a system for generating synthetic data;
- a system incorporating one or more virtual machines (VMs);
- a system implemented at least partially in a data center; or a system implemented at least partially using cloud computing resources.

* * * * *